United States Patent [19]
Yamazaki et al.

[11] Patent Number: 5,949,115
[45] Date of Patent: Sep. 7, 1999

[54] SEMICONDUCTOR DEVICE INCLUDING NICKEL FORMED ON A CRYSTALLINE SILICON SUBSTRATE

[75] Inventors: Shunpei Yamazaki, Tokyo; Jun Koyama; Satoshi Teramoto, both of Kanagawa, all of Japan

[73] Assignee: Semiconductor Energy Laboratory Co., Ltd., Kanagawa-ken, Japan

[21] Appl. No.: 09/203,549

[22] Filed: Dec. 1, 1998

Related U.S. Application Data

[62] Division of application No. 08/912,975, Aug. 13, 1997.

[30] Foreign Application Priority Data

Aug. 13, 1996 [JP] Japan .................................. 8-232607
Aug. 25, 1996 [JP] Japan .................................. 8-242603

[51] Int. Cl.⁶ .......................... H01L 29/30; H01L 23/58; H01L 29/167; H01L 29/207
[52] U.S. Cl. .................. 257/396; 257/617; 257/647; 257/655; 257/913
[58] Field of Search .................. 257/396, 617, 257/647, 655, 913

[56] References Cited

U.S. PATENT DOCUMENTS 4,177,084  12/1979  Law et al. .
4,751,193   6/1988  Myrick ........................................ 437/19
5,578,865  11/1996  Vu et al. ..................................... 257/611
5,643,826   7/1997  Ohtani et al. ............................... 437/88

FOREIGN PATENT DOCUMENTS 57-0160122  7/1982  Japan .

OTHER PUBLICATIONS

Fumio Shimura, "Semiconductor Silicon Crystal Engineering", K.K. Maruzen, pp. 217–240, Sep. 30, 1993.

*Primary Examiner*—Ngân V. Ngô
*Attorney, Agent, or Firm*—Fish & Richardson P.C.

[57] ABSTRACT

In a MOS semiconductor device utilizing a crystalline silicon substrate, the formation of a parasitic channel is suppressed. A solution of nickel acetate is applied to a silicon substrate 101 to form a layer including nickel indicated by 102. Thermal oxidation is performed to form a field oxide film 103 for device separation. At this time, a halogen element is included in the atmosphere. At this step, the action of nickel suppresses the formation of defects at the interface between the oxide film 103 and a channel region 106 and in the vicinity thereof, thereby suppressing the formation of a parasitic channel. Further, as a result of the action of the halogen element, nickel is gettered into the thermal oxidation film 103.

13 Claims, 21 Drawing Sheets

SEMICONDUCTOR DEVICE INCLUDING NICKEL FORMED ON A CRYSTALLINE SILICON SUBSTRATE

This is a divisional of U.S. application Ser. No. 08/912, 975, filed Aug. 13, 1997, (pending).

BACKGROUND OF THE INVENTION

1. Field of the Invention

The present invention relates to a configuration of a MOS transistor fabricated on a polycrystalline silicon substrate and a method of manufacturing the same. The present invention can be applied to MOS transistors that form an integrated circuit.

The present invention further relates to an SOI (silicon-on-insulator) structure which is a structure for forming single crystalline silicon on an insulator and a technique to provide the same structure.

More particularly, the present invention relates to a method of fabricating a single crystalline silicon layer referred to as "SIMOX" (separation-by-implanted oxygen) and a method of manufacturing a semiconductor device (e.g., transistor) utilizing such a silicon layer.

2. Description of the Related Art (A) Techniques for forming various integrated circuits (generally referred to as ICs) utilizing single crystalline silicon substrates are known. Such techniques include a technique for forming a MOS transistor utilizing a single crystalline silicon substrate.

FIG. 23 is a schematic sectional view of a typical MOS transistor. FIG. 23 shows a section taken in the direction of the width of the channel. FIG. 23 does not show the source and drain regions. The source and drain regions are assumed to exist on this side of the plane of the drawing and on the other side of the same, respectively. It is therefore assumed that, in operation, carriers move from this side of the plane of the drawing to the other side or in the opposite way.

FIG. 23 shows a P-type silicon substrate 1 serving as a base (a common single crystalline silicon wafer is used). MOS semiconductor devices and other devices such as resistors, capacitors and active devices (not shown) are formed using this single crystalline silicon substrate 1.

A reference numeral 5 designates a field oxide film produced using LOCOS (local oxidation of silicon). The field oxide film 5 provides separation of devices. Therefore, the field oxide film 5 can be regarded as an oxide film for device separation.

A reference numeral 6 designates a gate electrode. The gate electrode 6 faces the single crystalline silicon substrate 1 with a gate oxide film 4 interposed therebetween. A region 3 of the single crystal silicon substrate 1 that faces the gate electrode 6 serves as a channel region. FIG. 23 shows an example of an N-channel type MOS transistor having an N-type channel.

A reference numeral 2 designates a region doped to have $P^+$-type properties, i.e., a region that exhibits P-type properties stronger than that of the substrate 1. This region is provided in order to prevent the formation of a parasitic channel (undesired expansion of the channel in the direction of the width thereof).

A parasitic channel can establish an unintended path for carrier movement, thereby causing abnormal operations and malfunctions.

Although the $P^+$-type region (an $N^+$-type region if the channel is a P-type channel) 2 is effective in preventing the formation of a parasitic channel, it results in a problem in that the diffusion of heavily doped impurities that provide P-type properties (B (boron) and As (arsenide) are commonly used) in the channel puts a limit on the effective channel width. This results in a phenomenon referred to as "narrow channel effect".

The narrow channel effect increases the threshold voltage. Further, it ruins the linearity be the relationship between the channel conductance and the gate voltage. This results in a problem in that a clear threshold voltage can not be defined.

Such a phenomenon adversely affects the overall device designing. This problem is more serious, the smaller the design rule is.

(B) A technique referred to as "SIMOX (separation-by-implanted oxygen)" as been known as one of SOI (silicon-on-insulator) structures (structures in which single crystalline silicon is formed on an insulator). (See Tadao Shimura, "SEMICONDUCTOR SILICON CRYSTAL ENGINEERING", Maruzen K. K. p. 217, Sep. 30, 1993.)

This is a technique for forming a single crystalline silicon layer on a buried oxide layer through steps of:

(1) implanting oxygen ions of a high concentration into the single crystalline silicon substrate in a dose of about $10^{18}/cm^2$ or more; and (2) performing thermal annealing to cause the oxygen implanted at the step (1) to react with the silicon in the single crystalline silicon substrate, thereby forming a buried oxide layer (a layer constituted by a silicon oxide film) in the single crystalline silicon substrate.

An electronic device fabricated utilizing a single crystalline silicon layer obtained using the above-described SIMOX technique has the following advantages.

(1) An integrated circuit can be obtained in which a complete level of two-dimensional separation of devices can be achieved.

(2) Any parasitic capacitance between the devices and the substrate can be significantly reduced to allow the devices to operated at a higher speed. Further, it is possible to reduce crosstalk between the devices or between the devices and the wiring caused by parasitic capacitance through the substrate.

(3) Devices can be arranged in an three-dimensional arrangement.

(A) A possible technique for suppressing the above-described narrow channel effect in the conventional MOS semiconductor device shown in FIG. 23 is not to form the $P^+$ region 2 therein. As mentioned above, however, the $P^+$ region 2 has a function of suppressing the formation of a parasitic channel. Therefore, the omission of this region will result in significant problems associated with the formation of a parasitic channel.

It is an object of the present invention to provide a technique for obtaining a MOS transistor in which no parasitic channel of formed on the sides of the channel region without forming a $P^+$ region 2 ($N^+$ region if the channel is P-type).

(B) The SIMOX technique has problems as described below.

First, during an oxidizing reaction from which a buried oxide layer is formed, defects are formed in the vicinity of the interface between the buried oxide layer and single crystalline silicon layer (substrate) thereunder and in the vicinity of the interface between the buried layer and a single crystalline silicon layer thereon (which is used as the active layer of the device).

Such defects result from imperfect bonding of interstitial atoms (excess atoms interpenetrating lattices) and silicon atoms. They also originate from dislocation and the like.

Methods of reducing such defects include:
(1) performing a thermal process at a temperature as high as 1300° C. or more; and
(2) implanting oxygen ions in separate steps which are each accompanied by a thermal process at a high temperature (see the above-mentioned "SEMICONDUCTOR SILICON CRYSTAL ENGINEERING").

However, such methods have problems in that they require a high processing temperature and in that they result in complicated steps. Especially, a high temperature process puts a heavy burden on devices and it not preferable from the viewpoint of productivity.

It is an object of the present invention to solve the above-described problem with the technique of forming a single crystalline silicon layer utilizing SIMOX. In other words, it is an object of the present invention to provide a technique for forming a single crystalline silicon layer having a low defect density.

It is another object of the present invention to provide a device capable of high speed operations and having high reliability taking advantage of the above-described technique. It is still another object of the invention to solve the above-described problem without the need for a complicated process or a process at a high temperature.

It is a further object of the present invention to provide a technique for suppressing the effect of defects which are generally formed in a high density at an interface between a silicon oxide layer and a single crystalline silicon layer formed in contact with each other.

SUMMARY OF THE INVENTION

As Researches by the inventors have revealed that the presence of an edge of the field oxide film 5 (the edge which is in contact with the channel region) in FIG. 23 greatly contributes to the formation of the parasitic channel.

The field oxide film 5 includes, at the edge thereof, imperfectly bonded silicon oxide components which have been produced at the time of formation of the same.

The imperfectly bonded silicon oxide components are represented by $SiO_X$ (0<X<2).

The presence of the components having the composition expressed by $SiO_X$ (0<X<2) results in the local formation of a level having a high density.

If the P$^+$ region is not formed in the configuration shown in FIG. 23, the channel region 3 and the field oxide film 5 will be in contact with each other, and a level having a high density will be formed at the interface therebetween and in the vicinity of the interface.

FIGS. 24A through 24D are schematic views showing how the above-mentioned level is formed. As shown in FIGS. 24A and 24B, the thicker a $SiO_X$ layer (i.e., the more the $SiO_X$ components), the higher the defect density.

According to the understanding of the inventors, a level having a high density formed at the interface between the channel region 3 and the field oxide film 5 and in the vicinity thereof greatly contributes to the formation of a parasitic channel.

In order to solve the problem as described in the above item (A), the present invention has been conceived based on the understanding that the formation of a parasitic channel can be suppressed without forming the P$^+$ region 2 if the formation of a level having a high density can be suppressed at the interface between the channel region 3 and the field oxide film 5 and in the vicinity thereof.

According to an aspect of the present invention, there is provided a method of manufacturing a MOS semiconductor device utilizing a crystalline silicon substrate, comprising the steps of:

forming a thermal oxidation film for device separation on the crystalline silicon substrate; and reducing defects at an interface between the thermal oxidation film and channel regions of the MOS semiconductors and in the vicinity thereof using an intentionally introduced metal element for promoting the crystallization of silicon at a heating process in an oxidizing atmosphere including a halogen element.

The crystalline silicon substrate used in the above-described configuration is preferably a single crystalline silicon substrate used in normal integrated circuits.

As the metal element for promoting the crystallization of silicon, one or a plurality of kinds of elements selected from among Fe, Co, Ni, Ru, Rh, Pd, Os, Ir, Pt, Cu and Au may be used.

The use of nickel is most preferable from the view point of effectiveness and reproducibility. A metal element for promoting the crystallization of silicon is an element which has an effect of promoting the crystallization of silicon which is amorphous or imperfect in crystallinity by means of heating (referred to as "solid phase growth").

The oxidizing atmosphere including a halogen element used in the above-described configuration may be an oxidizing atmosphere including at least one kind of gas selected from among HCl, HF, $NF_3$ and $ClF_3$.

According to another aspect of the invention, there is provided a method of manufacturing a MOS semiconductor device utilizing a crystalline silicon substrate, comprising the steps of:

intentionally introducing a metal element for promoting the crystallization of silicon; and forming a thermal oxidation film for device separation by means of a heating process in an oxidizing atmosphere including a halogen element.

According to still another aspect of the invention, there is provided a method of manufacturing a MOS semiconductor device utilizing a crystalline silicon substrate, comprising the steps of:

forming a thermal oxidation film for device separation;

intentionally introducing a metal element for promoting the crystallization of silicon; and performing a heating process in an oxidizing atmosphere including a halogen element.

According to a further aspect of the invention, there is provided a configuration in which MOS semiconductor devices are formed utilizing a crystalline silicon substrate; a thermal oxidation film for device separation is formed in the crystalline silicon substrate; and the concentration of a metal element for promoting the crystallization of silicon in channel regions of the MOS semiconductor devices is lower than that in the thermal oxidation film.

Further, in the above-described configuration, the concentration of a halogen element in the channel regions of the MOS semiconductor devices is lower than that in the thermal oxidation film.

FIGS. 1A through 1C show steps for fabricating a MOS semiconductor device according to the present invention. As shown in the step in FIG. 1A, a layer 102 including nickel is formed on a crystalline silicon substrate 101 to introduce nickel, and selective thermal oxidization is performed in an oxidizing atmosphere including a halogen element to form a field thermal oxidation film 103 for device separation.

The action of nickle makes it possible to reduce imperfectly bonded silicon oxide components expressed by $SiO_X$ (0<X<2) in the vicinity 105 of the interface between a region 106 where the channel of the MOS transistor is to be formed and the thermal oxidation film 103.

The imperfectly bonded silicon oxide components expressed by $SiO_X$ (0<X<2) cause lattice distortions and defects in silicon regions adjacent thereto (e.g., the channel region of the MOS transistor), resulting in the formation of a level having a high density.

Therefore, the imperfectly bonded silicon oxide components expressed by $SiO_X$ (0<X<2) are reduced and lattice distortions formed in silicon regions is moderated. The defect density in the silicon region is obviously reduced. Thus, it is possible to reduce the density of a level, for example, in the region indicated by 105 in FIGS. 1B and 1C.

The action of nickel promotes the organization of silicon (this can be regarded as crystallization from another point of view) and, as a result, lattice distortions are moderated and defects are reduced in silicon regions (e.g., the region indicated by 105 in FIG. 1).

Another significant contribution to the above-described effect is the fact that bonding of silicon atoms and oxygen atoms which proceeds as the thermal oxidation film promotes the reorganization of the silicon atoms.

A silicon region thus obtained is in a substantially single crystalline state in which lattice distortions have been moderated and defects have been reduced. This state is essentially different from that of a semiamorphous semiconductor as disclosed in Japanese Laid-Open Application No. 57-160122 associated with the application of the present applicant which is based on an assumption that there are lattice distortions.

The action of nickel promotes transition from the imperfectly bonded state expressed by $SiO_X$ (0<X<2) to a bonded state expressed by $SiO_2$ also in the oxidation film 103.

This makes it possible to reduce the defect density as shown in FIGS. 24C and 24D.

The moderation of lattice distortions and the reduction of defects in silicon regions as described above play an important roll in suppressing local segregation (concentration) of nickel. Lattice distortions and defects easily localize to form grain boundaries where the segregation of nickel can easily occur. The nickel segregated in such a state make it difficult to cause gettering and can adversely affect device characteristics later.

By forming the thermal oxidation film 103 in an oxidizing atmosphere including a halogen element, the thermal oxidation film 103 can be gettered with nickel. This is important in reducing nickel residual in the region which will finally constitute the channel. As a result, the density of nickel in the thermal oxidation film 103 becomes higher than that in the channel region. The concentration of the halogen element is also higher in the oxidization film than in the channel region.

In order to solve the problem as described in the above item (B), according to a further aspect of the invention, there is provided a method of manufacturing a semiconductor device including a silicon oxide layer formed in a crystalline silicon substrate and a single crystalline silicon layer formed on the silicon oxide layer, comprising the steps of:

intentionally adding nickel in the silicon substrate when the single crystalline silicon layer is formed; and
  intentionally removing the nickel.

The crystalline silicon substrate in the above-described configuration may be single crystalline silicon wafers which are commonly used or may be substrates which include crystal grain boundaries or segregated impurities in regions having nothing to do with the formation of devices. It is generally preferable to use a highly pure single crystal silicon wafer having a low defect density fabricated using a state-of-the-art technique as the crystalline silicon substrate described above.

Gettering using nickel may be performed through a heating process in an atmosphere including a halogen element. In this case, nickel evaporates into the atmosphere in the form of $NiCl_2$ or $NiF_2$ to be removed.

It is advantageous to providing the atmosphere with oxidizing properties to allow a thermal oxidation layer to be formed in the heating process. The action of the halogen element helps gettering of the nickel in the thermal oxidation layer (thermal oxidation film). This makes it possible to reduce the concentration of the residual nickel from a concentration of $10^{18}/cm^3$ or more to a concentration on the order of $10^{17}/cm^3$ or less.

The halogen element may be introduced using a gas including at least Cl and/or F. For example, HF, $NF_3$, $ClF_3$ or gases including such compounds may be used.

HCl may be mixed in the oxidizing atmosphere at a percentage in the range from 1% to 10%, and $NF_3$ may be mixed in the oxidizing atmosphere at a percentage in the range from 0.1% to 1%.

The thermal oxidation layer is formed at a temperature in the range from 700° C. to 1200° C., preferably from 800° C. to 1200° C.

According to a still further aspect of the invention, there is provided a method of manufacturing a semiconductor device including a silicon oxide layer formed in a 10 crystalline silicon substrate and a single crystalline silicon layer formed on the silicon oxide layer, comprising the steps of:

intentionally adding a metal element for promoting the crystallization of silicon in the silicon substrate when the single crystalline silicon layer is formed; and
  intentionally removing the metal element.

As the metal element for promoting the crystallization of silicon, one or a plurality of kinds of elements selected from among Fe, Co, Ni, Ru, Rh, Pd, Os, Ir, Pt, Cu and Au may be used.

The use of nickel as the metal element is most preferable from the view point of effectiveness and reproducibility.

According to a still further aspect of the invention, there is provided a method of manufacturing a semiconductor device including a silicon oxide layer formed in a crystalline silicon substrate and a single crystalline silicon layer formed on the silicon oxide layer, comprising the steps of:

intentionally introducing nickel when the single crystalline silicon layer is formed; and
  removing the intentionally introduced nickel by means of thermal oxidization.

According to a still further aspect of the invention, there is provided a method of manufacturing a semiconductor device including a silicon oxide layer formed in a crystalline silicon substrate and a single crystalline silicon layer formed on the silicon oxide layer, comprising the steps of:

intentionally introducing a metal element for promoting the crystallization of silicon when the single crystalline silicon layer is formed; and
  removing the intentionally introduced metal element by means of thermal oxidization.

According to a still further aspect of the invention, there is provided a method comprising the steps of:

doping a crystalline silicon substrate with oxygen;
  keeping nickel in contact with a surface of the crystalline silicon substrate;
  forming a silicon oxide layer in the crystalline silicon substrate by means of a heating process;
  forming a thermal oxidation layer on the surface of the crystalline silicon substrate; and removing the thermal oxidation layer, wherein a single crystalline silicon layer is obtained on the silicon oxide layer.

According to a still further aspect of the invention, there is provided a method comprising the steps of:

doping a crystalline silicon substrate with oxygen;

forming a silicon oxide layer in the crystalline silicon substrate by means of a heating process;

keeping nickel in contact with a surface of the crystalline silicon substrate;

forming a thermal oxidation layer on the surface of the crystalline silicon substrate; and removing the thermal oxidation layer, wherein a single crystalline silicon layer is obtained on the silicon oxide layer.

According to a still further aspect of the invention, there is provided a method comprising the steps of:

keeping nickel in contact with a surface of the crystalline silicon substrate;

doping a crystalline silicon substrate with oxygen;

forming a silicon oxide layer in the crystalline silicon substrate by means of a heating process and, at the same time, forming a thermal oxidation layer on the surface of the crystalline silicon substrate; and removing the thermal oxidation layer, wherein a single crystalline silicon layer is obtained on the silicon oxide layer.

According to a still further aspect of the invention, there is provided a method comprising the steps of:

doping a crystalline silicon substrate with oxygen;

keeping a metal element for promoting the crystallization of silicon in contact with a surface of the crystalline silicon substrate;

forming a silicon oxide layer in the crystalline silicon substrate by means of a heating process and, at the same time, forming a thermal oxidation layer on the surface of the crystalline silicon substrate; and removing the thermal oxidation layer, wherein a single crystalline silicon layer is obtained on the silicon oxide layer.

According to a still further aspect of the invention, there is provided a method comprising the steps of:

doping a crystalline silicon substrate with oxygen;

keeping a metal element for promoting the crystallization of silicon in contact with a surface of the crystalline silicon substrate;

forming a silicon oxide layer in the crystalline silicon substrate by means of a heating process;

forming a thermal oxidation layer on the surface of the crystalline silicon substrate; and removing the thermal oxidation layer, wherein a single crystalline silicon layer is obtained on the silicon oxide layer.

According to a still further aspect of the invention, there is provided a method comprising the steps of:

doping a crystalline silicon substrate with oxygen;

forming a silicon oxide layer in the crystalline silicon substrate by means of a heating process;

keeping a metal element for promoting the crystallization of silicon in contact with a surface of the crystalline silicon substrate;

forming a thermal oxidation layer on the surface of the crystalline silicon substrate; and removing the thermal oxidation layer, wherein a single crystalline silicon layer is obtained on the silicon oxide layer.

According to a still further aspect of the invention, there is provided a method comprising the steps of:

keeping a metal element for promoting the crystallization of silicon in contact with a surface of a crystalline silicon substrate;

doping the crystalline silicon substrate with oxygen;

forming a silicon oxide layer in the crystalline silicon substrate by means of a heating process and, at the same time, forming a thermal oxidation layer on the surface of the crystalline silicon substrate; and removing the thermal oxidation layer, wherein a single crystalline silicon layer is obtained on the silicon oxide layer.

According to a still further aspect of the invention, there is provided a method comprising the steps of:

doping a crystalline silicon substrate with oxygen;

keeping a metal element for promoting the crystallization of silicon in contact with a surface of the crystalline silicon substrate;

forming a silicon oxide layer in the crystalline silicon substrate by means of a heating process and, at the same time, forming a thermal oxidation layer on the surface of the crystalline silicon substrate; and removing the thermal oxidation layer, wherein a single crystalline silicon layer is obtained on the silicon oxide layer.

According to a still further aspect of the invention, there is provided a configuration comprising:

a silicon oxide layer formed in a crystalline silicon substrate and a single crystalline silicon layer formed on the silicon oxide layer;

an active layer for at least one device formed utilizing the single crystalline silicon layer; and a metal element present in the active layer with a distribution of concentration in which the concentration increases toward the interface opposite to the silicon oxide layer.

The metal element in the above-described configuration is one or a plurality of kinds of elements selected from among Fe, Co, Ni, Ru, Rh, Pd, Os, Ir, Pt, Cu and Au.

According to a still further aspect of the invention, there is provided an electronic apparatus having semiconductor devices comprising a silicon oxide layer formed in a crystalline silicon substrate and a single crystalline layer formed on the silicon oxide layer, wherein:

an active layer for at least one device is formed utilizing the single crystalline silicon layer; and a metal element is present in the active layer with a distribution of concentration in which the concentration increases toward the interface opposite to the silicon oxide layer.

The electronic apparatus may be a personal computer, a portable video camera or any one of a variety of information terminals.

According to a still further aspect of the invention, there is provided a method comprising the steps of:

forming a silicon oxide layer in a crystalline silicon substrate or on a surface thereof such that it is adjacent to a single crystalline silicon layer;

intentionally introducing nickel before the formation of the silicon oxide layer; and intentionally removing the nickel during or after the formation of the silicon oxide layer.

According to a still further aspect of the invention, there is provided a method comprising the steps of:

forming a silicon oxide layer in a crystalline silicon substrate or on a surface thereof such that it is adjacent to a single crystalline silicon layer;

intentionally introducing a metal element for promoting the crystallization of silicon before the formation of the silicon oxide layer; and intentionally removing the metal element during or after the formation of the silicon oxide layer.

Referring to FIGS. 10A through 10E, a specific embodiment of the present invention comprises the steps of:

doping a single crystalline silicon substrate 401 with oxygen (FIG. 10A);

keeping nickel in contact with a surface of the single crystalline silicon substrate (FIG. 10B);

forming a silicon oxide layer 404 in the single crystalline silicon substrate by means of a heating process (FIG. 10C);

forming a thermal oxidation layer 407 on the surface of the single crystalline silicon substrate (FIG. 10D); and removing the thermal oxidation layer (FIG. 10E), wherein a single crystalline silicon layer 408 is obtained on the silicon oxide layer 405.

In the above-described steps, the action of nickel allows defects in the single crystalline silicon layer 408 to be reduced, and the formation of the thermal oxidation layer 407 makes it possible to promote the reduction of defects and the gettering of nickel (removal thereof from the single crystalline silicon layer 408).

Especially, it is passible to significantly reduce defects formed in the single crystalline silicon layer in the vicinity of the interface between itself and the silicon oxide film.

When the silicon oxide film is formed, in general, an imperfectly bonded layer having unbound arms as expressed by $SiO_X$ (0<X<2) is formed between the $SiO_2$ layer and the Si layer.

FIGS. 25A through 25D schematically illustrate the above-described model. FIG. 25A shows a state wherein an imperfectly bonded layer expressed by $SiO_X$ (0<X<2) as described above is formed between the silicon oxide ($SiO_2$) layer and the single crystalline silicon (Si) layer.

In general, when the silicon oxide layer as indicated by 105 in FIG. 10 is formed, a layer as expressed by $SiO_X$ (0<X<2) as described above is undesirably formed. This layer has deformation energy attributable to imperfect bonding.

Obviously, this layer includes defects in a density higher than that of a silicon oxide layer having a substantially perfect composition expressed by $SiO_2$ and that of a single crystalline silicon layer. Correspondingly, levels are formed this layer in a high density. The defects are distributed as shown in FIG. 25B. FIG. 25B is a graph for clearly showing relative distribution of the defects.

A heating process in such a state after intentionally introducing nickel will cause a reaction among Si, O and Ni to promote reorganizing of atoms.

As a result, as shown in FIG. 25C, the layer expressed by $SiO_X$ (0<X<0) is reduced in width (thickness) and can even be removed. This also results in the release of the deformation energy, which significantly reduces the defect density as shown in FIG. 25D.

The above-described heating process also results in a state in which nickel excessively concentrates at the interface. Then, a heating process is performed in an atmosphere including a halogen element (this heating process may be concurrent with the process for removing $SiO_X$) to remove (or getter) the nickel. Specifically, the nickel and halogen element are bound together and are evaporated. Thermal oxidization performed in this state will getter the nickel into a resultant thermal oxidation film. The nickel bound with the halogen element to be evaporated and removed.

If a $SiO_X$ layer as shown in FIG. 25A exists, the operation of devices obtained by separation provided by the silicon oxide layer is adversely affected by levels resulting from defects included in the $SiO_X$ layer in a high density. This effect is more significant for finer devices. It is therefore advantageous to utilize the present invention in reducing the defects included in the $SiO_X$ layer.

DETAILED DESCRIPTION OF PREFERRED EMBODIMENTS

Preferred embodiments of the present invention will now be described with reference to the drawings. Embodiments 1 through 8 of the present invention are examples in which the present invention is applied to a method of fabricating MOS semiconductor device utilizing the LOCOS process. Embodiments 9 through 18 of the present invention are examples in which the present invention is applied to a method of fabricating a semiconductor device utilizing the SIMOX technique.

Embodiment 1

FIGS. 1A through 1C and FIG. 2 show steps for fabricating a MOS transistor according to the present embodiment. First, a crystalline silicon substrate 101 is provided. It is preferable to use a single crystalline silicon substrate of a grade as high as possible as the crystalline silicon substrate 101.

A thermal oxidation film 13 and a mask pattern 104 constituted by a silicon nitride film are formed on the crystalline silicon substrate 101. The mask pattern 104 is used in selective thermal oxidation for forming a field oxide film.

Next, the crystalline silicon substrate 101 is subjected to half-etching as indicated by 11 and 12 using the mask pattern 104. The half-etched portions indicated by 11 and 12 have a function of preventing a field oxide film to be formed later from bulging up toward the surface.

Figure 1A:
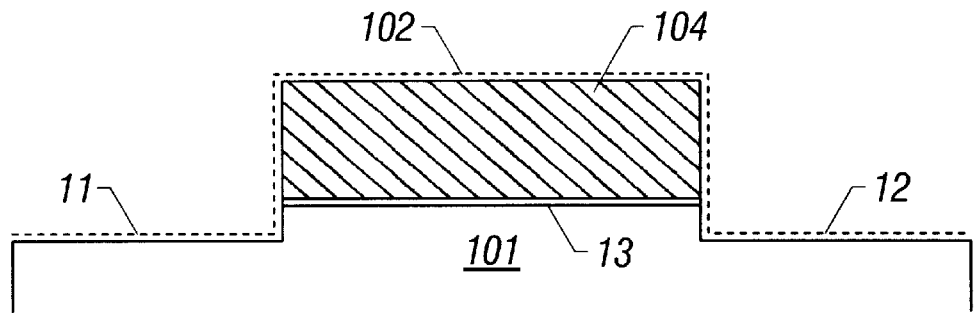
FIGS. 1A through 1C are views showing steps for fabricating a MOS transistor according to the embodiment 1 of the present invention.

A spin coating is then performed to apply a solution of nickel acetate, thereby forming a layer 102 including nickel as shown in FIG. 1A. The introduction of nickel using this solution is advantageous in that the concentration of the introduced nickel can be easily adjusted. Instead of using such a solution, sputtering, CVD, vacuum deposition or plasma processing (utilizing plasma discharge from an electrode including nickel) may be used.

Figure 1B:
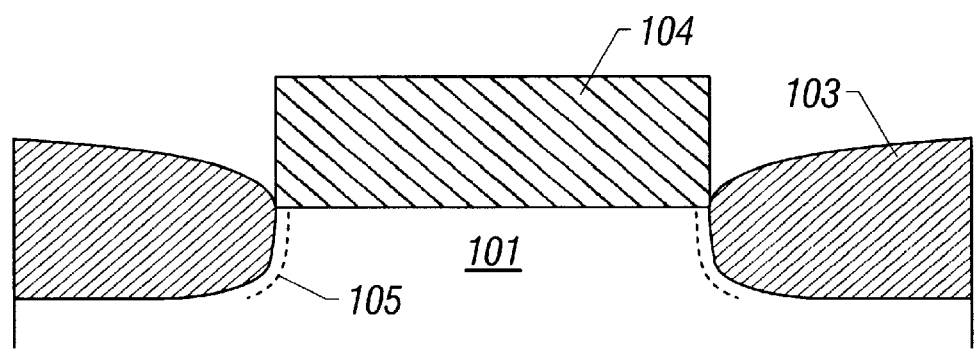

Next, as shown in FIG. 1B, the mask pattern 104 constituted by a silicon nitride film is formed. Then, selective thermal oxidation is carried out to form a thermal oxidation film (field oxide film) for device separation indicated by 103.

The thermal oxidation film 103 is formed by performing a heating process at a temperature of 1100° C. in an oxygen atmosphere including 3% HCl, in other words, in an oxidizing atmosphere including a halogen element.

When the thermal oxidation film 103 is formed, the action of nickel reorganizes Si and O are to achieve a higher level of bonding therebetween at the interface between the thermal oxidation film 103 and the crystalline silicon and in the vicinity thereof. That is, components having a composition expressed by $SiO_X$ (0<X<0) are reorganized into components having a composition expressed by $SiO_2$.

Specifically, nickel acts like a catalyst to promote the bonding between Si atoms and between Si and O and, at the same time, the action of chlorine in the atmosphere getters the nickel in the thermal oxidation film thus formed. A part of nickel elements are evaporated into the atmosphere in the form of $NiCl_2$. This promotes the reorganization as described above.

As a result of the gettering as described above, the concentration of nickel in the channel region 106 becomes $1 \times 10^{17}/cm^3$ or less which is a value below the limit of measurement for SIMS (secondary ion mass spectrometry).

This suppresses the formation of defects in the region indicated by 105 in FIG. 1B. That is, the formation of defects is suppressed at the interface between the thermal oxidation film 103 and the region where the channel is to be formed and in the vicinity thereof.

Figure 1C:
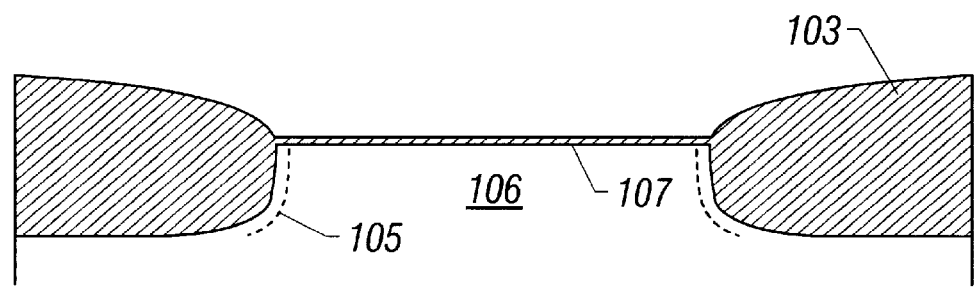
Figure 2:
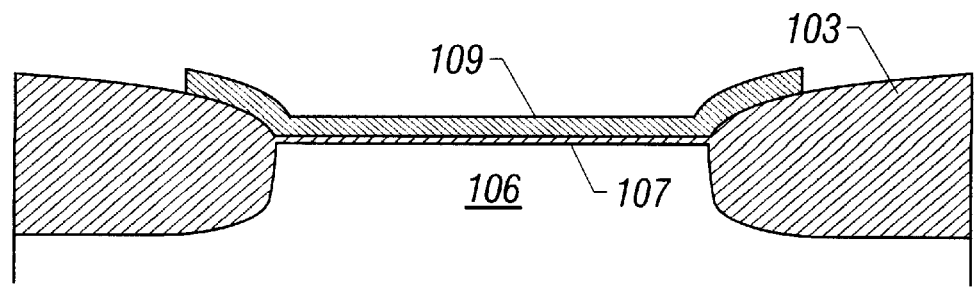
FIG. 2 is a sectional view of the MOS transistor according to the embodiment 1 of the present invention.

After the field oxide film (thermal oxidation film) 103 is formed, the silicon nitride pattern 104 and thermal oxidation film 103 are removed and thermal oxidization is performed again. As a result, a thermal oxidation film 107 which will serve as a gate insulation film is formed as shown in FIG. 1C.

Next, a gate electrode 109 is formed from an appropriate metal material. The channel will be formed in the region indicated by 106 in the crystalline silicon substrate that faces the gate electrode 109.

The configuration shown in the present embodiment makes it possible to suppress the formation of defects in a high density in the regions 105 on both sides of the region which will become the channel region.

This in turn makes it possible to suppress the formation of a parasitic channel due to such defects.

Figure 23:
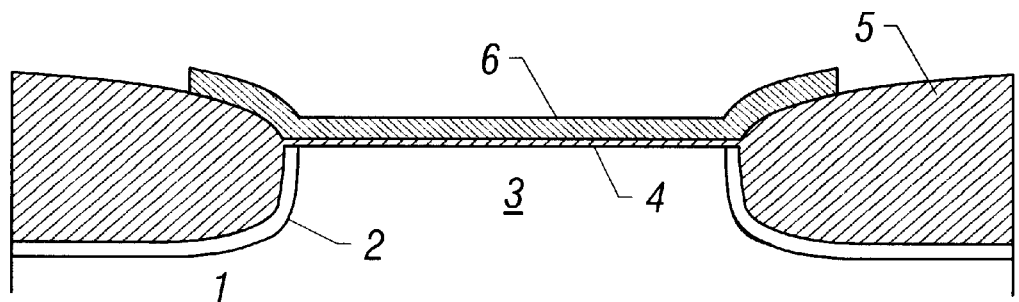
FIG. 23 is a sectional view of a conventional MOS transistor.

Further, since there is no need for providing a region having the conductivity type reverse to that of channel (P+ type in the present embodiment) as indicated by 2 in FIG. 23, the occurrence of a narrow channel effect can be suppressed to some degree even with a reduced design rule.

Embodiment 2

Figure 3A:
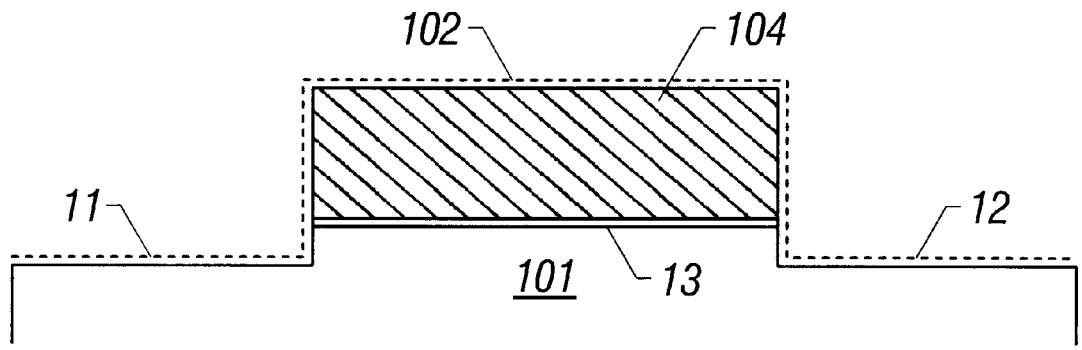
FIGS. 3A through 3C are sectional views of a MOS transistor according to the embodiment 2 of the present invention.
Figure 3B:
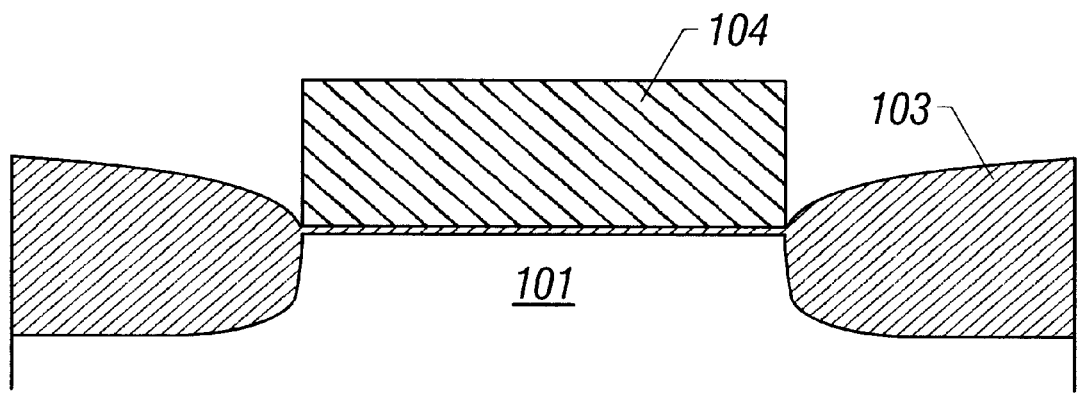

FIGS. 3A through 3C, FIG. 4A and FIG. 4B show fabrication steps according to the present embodiment. First, a crystalline silicon substrate 101 is provided as shown in FIG. 3A. Next, a mask pattern 104 constituted by a silicon nitride film is formed as shown in FIG. 3B. Further, selective thermal oxidization is performed to form a field thermal oxidation film indicated by 103. This thermal oxidation film 103 may be formed by a normal method.

Figure 3C:
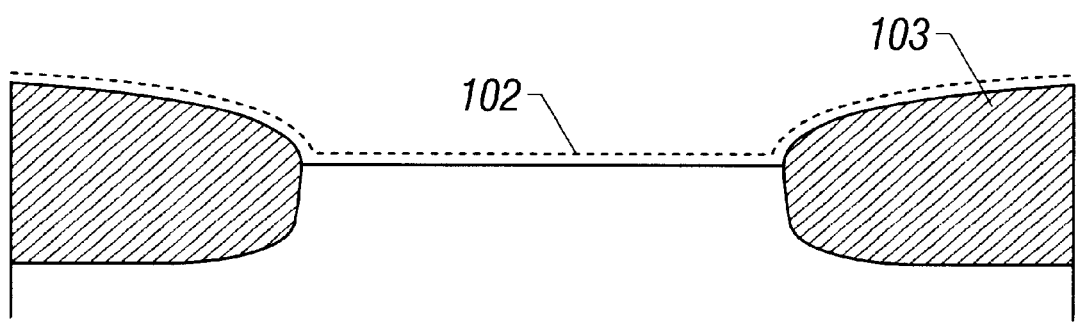

Then, as shown in FIG. 3C, a solution of nickel acetate prepared to have a predetermined concentration of nickel is applied by means of spin coating to form a layer 102 including nickel.

Figure 4A:
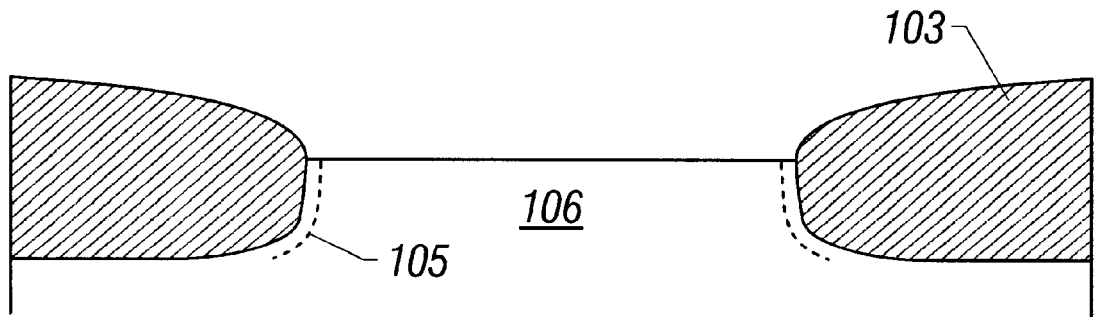
FIGS. 4A and 4B are sectional views of the MOS transistor according to the embodiment 2 of the present invention.

Next, another heating process is performed in the state shown in FIG. 4A This heating process is performed at 1050° C. in an oxygen atmosphere including 3% HCl. As a result, the nickel introduced at the step shown in FIG. 3C is diffused and, as a result of the action of nickel, components having a composition expressed by $SiO_X$ (0<X<2) present in the region indicated by 105 in a high density are reorganized into $SiO_2$. Further, the action of chlorine promotes gettering of nickel from the active layer (source/drain region and channel region) into the thermal oxidation film 103.

The reduction of $SiO_X$ components allows a reduction of defects originating from such components.

Figure 4B:
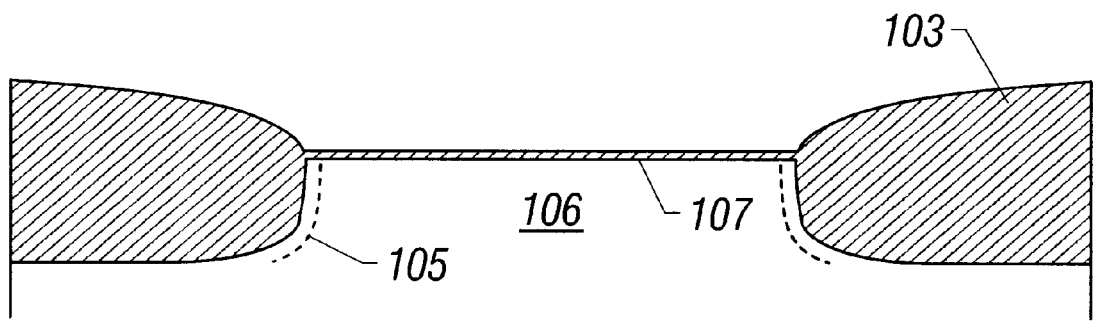

When the heating process in the state shown in FIG. 4A is complete, a gate insulation film 107 is formed using thermal oxidation as shown in FIG. 4B. A region 106 under the gate insulation film 107 will become the channel region.

Embodiment 3

According to the present embodiment, in the configuration described in the embodiment 1 annealing is carried out after the formation of thermal oxidation film 103 by performing another heating process in an atmosphere including a halogen element.

This further ensures the effect of gettering nickel.

Embodiment 4

According to the present embodiment, in the configuration described in the embodiment 1, the thermal oxidation film 103 is formed using a normal thermal oxidation process and annealing is performed thereafter through a heating process in an atmosphere including a halogen element.

Embodiment 5

The present embodiment concerns an arrangement to form a field oxide film for device separation using a method different from that described in the embodiment 1.

Figure 5A:
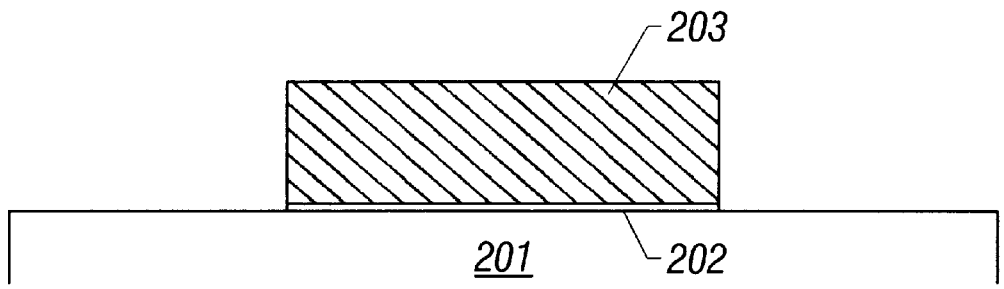
FIGS. 5A through 5C are views showing steps for fabricating a MOS transistor according to the embodiment 5 of the present invention.

FIGS. 5A through 5C and FIG. 6 show fabrication steps according to the present embodiment. First, as shown in FIG. 5A, a thermal oxidation film 202 is formed on a crystalline silicon substrate 201 and a mask pattern 203 constituted by a silicon nitride film is further formed.

Next, the crystalline silicon substrate 201 is selectively etched using the mask pattern 203 constituted by a silicon nitride film. As a result of this process, as shown in FIG. 5B, the regions indicated by 205 and 206 are etched off.

Figure 5B:
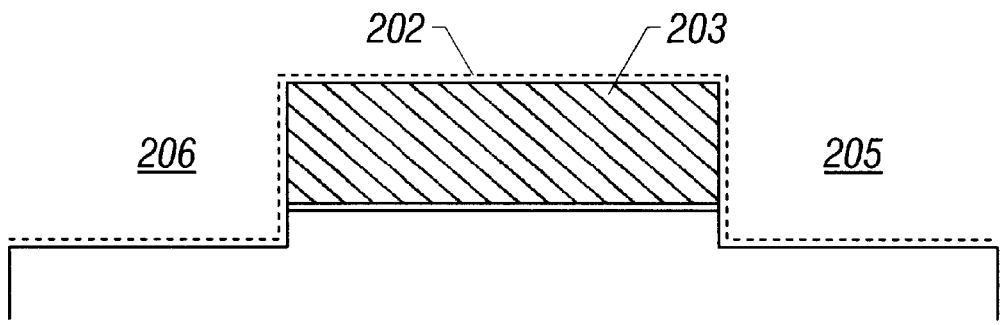

Then, a solution of nickel acetate is applied to form a layer 204 including nickel (FIG. 5B).

Figure 5C:
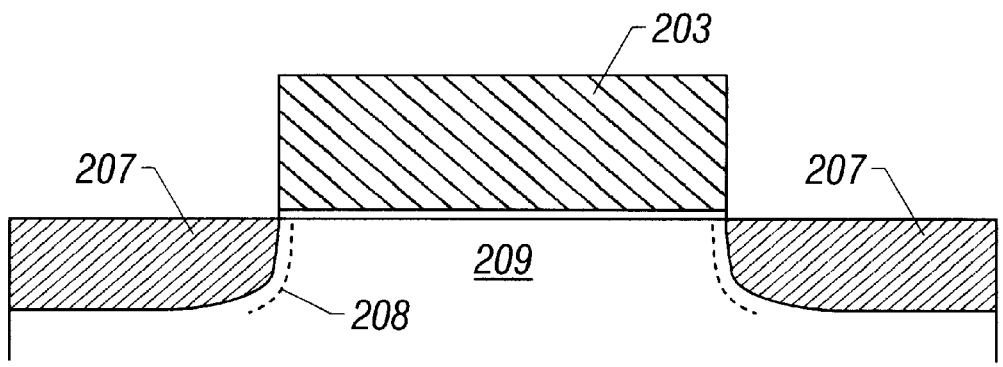
Figure 6:
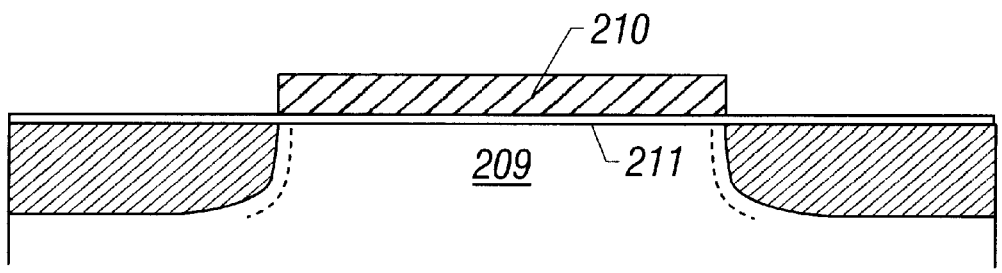
FIG. 6 is a sectional view of the MOS transistor according to the embodiment 5 of the present invention.

Next, as shown in FIG. 5C, a thermal oxidization process is carried out to form a field thermal oxidation film 207. This step is performed in an oxidizing atmosphere including 3% HCl. At this time, the volume etched at the step shown in FIG. 5B and the volume of the thermal oxidation film 207 thus formed collectively form a configuration as shown in FIG. 5C.

When the field thermal oxidation film 207 is formed as described above, the action of nickel suppresses the formation of defects in the vicinity of a channel region 209 and the field thermal oxidation film 207.

Next, the mask pattern 203 and the thermal oxidation film 202 thereunder are removed to form another thermal oxidation film 211 which will serve as a gate insulation film. Then, a gate electrode 210 is formed.

Embodiment 6

The present embodiment concerns an arrangement forming a field oxide film for device separation using a method different from that in the embodiment 1.

Figure 7A:
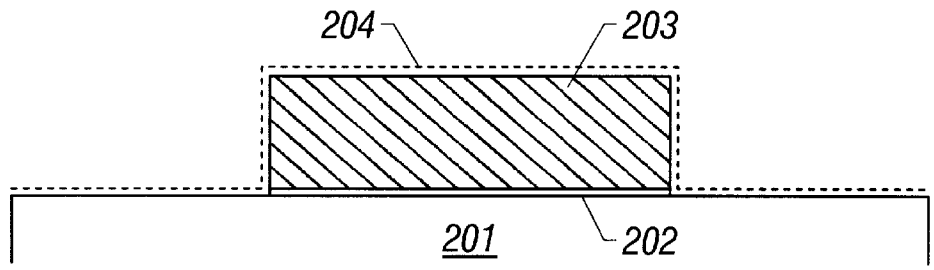
FIGS. 7A and 7B are views showing steps for fabricating a MOS transistor according to the embodiment 6 of the present invention.
Figure 7B:
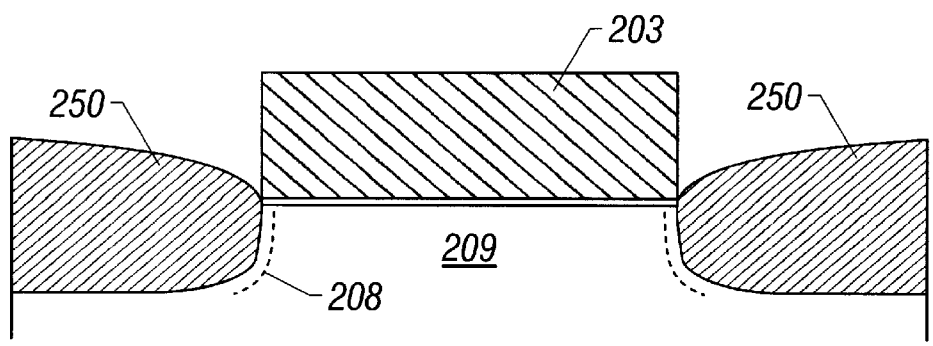

FIGS. 7A and 7B show fabrication steps according to the present embodiment. First, as shown in FIG. 7A, a thermal oxidation film 202 is formed on a crystalline silicon substrate 201 and a mask pattern 203 constituted by a silicon nitride film is further formed.

Next, a solution of nickel acetate is applied to form a layer 204 including nickel (FIG. 7A).

Next, as shown in FIG. 7B, a thermal oxidization process is carried out to form a field thermal oxidation film 250. This step is performed in an oxidizing atmosphere including 3% HCl.

When the field thermal oxidation film 250 is formed as described above, the action of nickel suppresses the formation of defects in the vicinity of interfaces indicated by 208 between a channel region 209 and the field thermal oxidation film 250. Subsequently, a gate electrode 203 is formed by performing the same step as in the embodiment 1.

Embodiment 7

The present embodiment concerns an arrangement to allow gettering of nickel in an active region (a silicon region used to provide functions of a device, such as a channel region) to be performed more effectively.

Figure 8A:
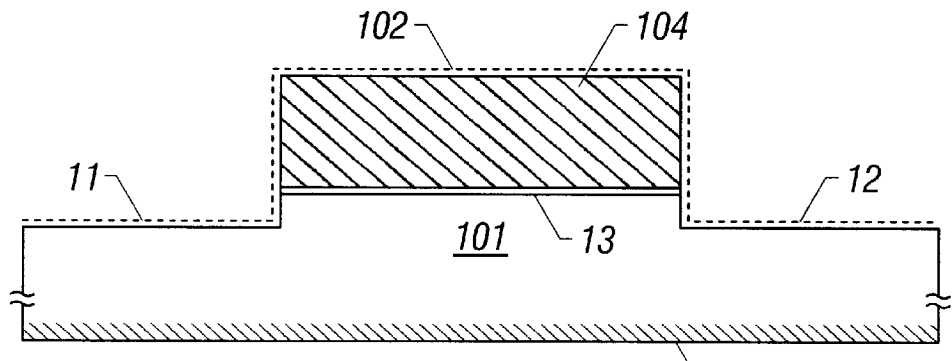
FIGS. 8A and 8B are sectional views of a MOS transistor according to the embodiment 7 of the present invention.
Figure 8B:
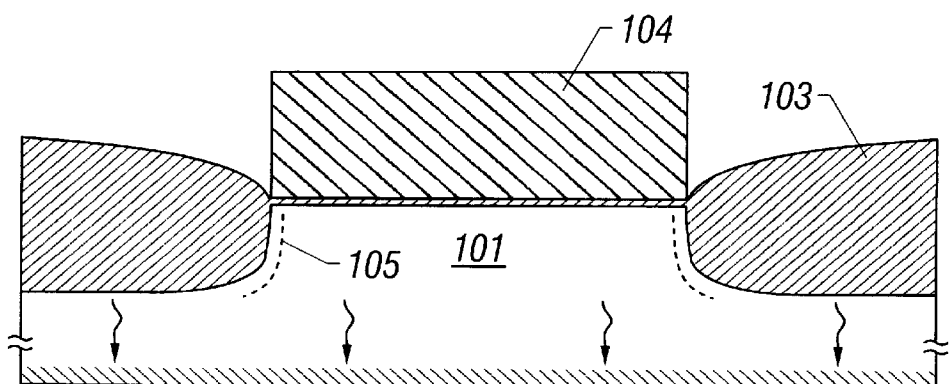

FIGS. 8A and 8B show fabrications steps according to the present embodiment. According to the present embodiment, in a configuration as described in the embodiment 1, defects and distortions are intentionally formed on a backside 10 of a crystalline silicon substrate 101.

This is carried out using a mechanical process or implantation of impurity ions. This makes it possible to getter nickel into the region 10 when defects and distortions have been intentionally introduced during the heating step.

This process will now be described in detail. First, defects and distortions are intentionally formed on the backside 10 of the crystalline silicon substrate 101 using a mechanical grinding means. Then, a mask pattern 104 constituted by a silicon nitride film through a thermal oxidation film 13.

Next, etching is performed as indicated by 11 and 12, and a layer 102 including nickel is formed using a means that employs a solution. Thus, the state shown in FIG. 8A is realized.

Then, a heating process is performed in an oxidizing atmosphere including a halogen element to form a thermal oxidation film 103. At this time, gettering of nickel into the thermal oxidation film 103 is accompanied by gettering of nickel into the region indicated by 10 which occurs concurrently.

It is advantageous to perform another heating process after the formation of thermal oxidation film 103 to further improve the effect of gettering of nickel into the region indicated by 10.

Embodiment 8

The present embodiment is an example of the application of the invention to a well-know IC process.

FIGS. 9A through 9E show the process of fabricating a CMOS of the present embodiment. The present embodiment shows an example which is based on a well known conventional IC process.

Figure 9A:
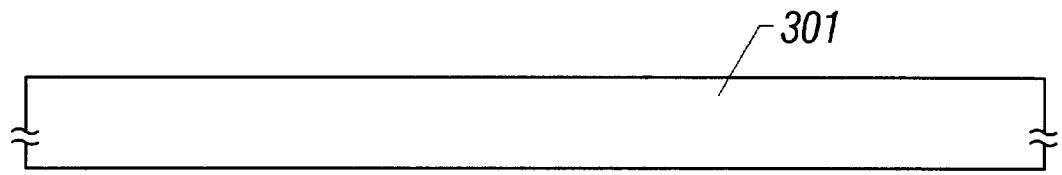
FIGS. 9A through 9E are views showing steps for fabricating a CMOS device according to the embodiment 8 of the present invention.

First, as shown in FIG. 9A, a single crystalline silicon substrate 301 is provided, and a thermal oxidation film 302 is formed on a surface thereof. Further, silicon nitride film patterns 303 and 304 are formed in preparation for forming a field oxidation film selectively.

Figure 9B:
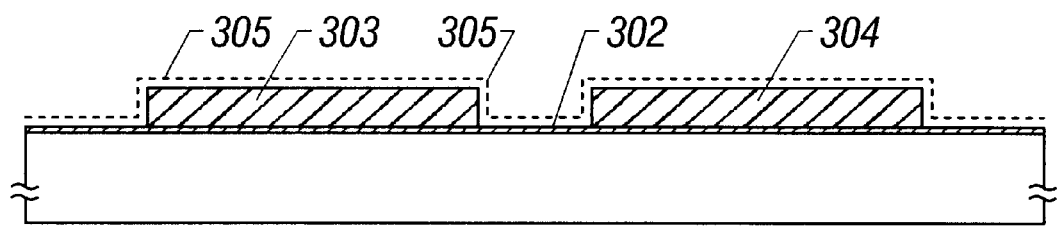

After forming the silicon nitride film patterns 303 and 304, a solution of nickel acetate is applied to form a layer 305 including nickel. That is, a state is realized in which nickel is kept in contact with the surface of the single crystalline silicon substrate 301 in regions other than the regions where the silicon nitride films 303 and 304 are formed. Thus, the state shown in FIG. 9B is realized.

Figure 9C:
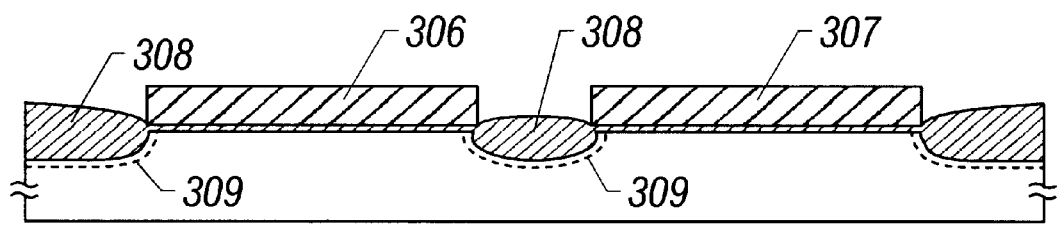

Thermal oxidation is performed to form field oxide layers indicated by 308. Each device region is separated from others by the field oxide layers 308. Thus, the state shown in FIG. 9C is realized.

At this point, the action of oxygen and nickel corrects defects resulting from imperfect bonding as expressed by $SiO_x$ (0<X<0) in the vicinity of single crystalline regions indicated by 309 in the single crystalline silicon substrate 301 and the field oxide layers 308.

Next, gate electrodes 310 and 311 are formed. Then, P ions are implanted in regions 312 and 313 using a resist mask which is not shown. Further, B ions are implanted in regions 314 and 315 using another resist mask.

After the implantation of the impurity ions, a heating process is performed to activate the regions where the impurity ions have been implanted.

Figure 9D:
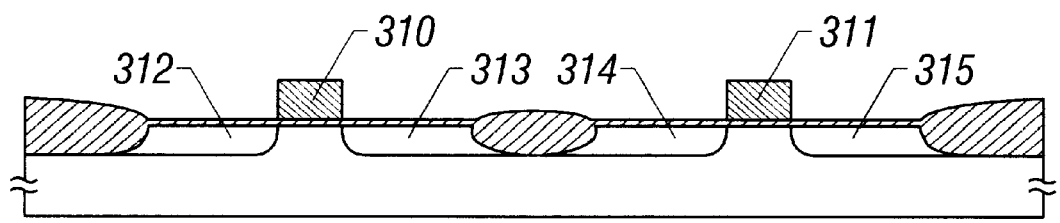

Thus, as shown in FIG. 9D, the source region 312 and drain region 313 of an N-channel type thin film transistor shown on the left-hand side of the figure and the source region 314 and drain region 315 of a P-channel thin film transistor shown on the right-hand side of the figure are formed in a self-alignment manner.

Figure 9E:
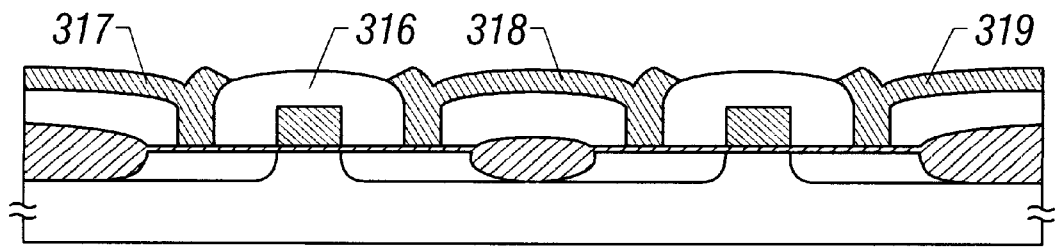

Next, an interlayer insulation film 316 is formed. Then, contact holes are formed to form source electrodes 317 and 319 and a common drain electrode 318. This results in a CMOS structure as shown in FIG. 9E.

The configuration shown in the present embodiment makes it possible to suppress the effect of defects which are formed when the field oxide layers are formed. This technique is advantageous in an integrated circuit for which a higher level of integration and operations at a higher speed are required.

Embodiment 9 through 18 of the present invention to be described below are embodiments of methods for fabricating a semiconductor device utilizing the SIMOX technique.
Embodiment 9

FIGS. 10A through 10E show fabrication steps according to the present embodiment. According to the present embodiment, a single crystalline silicon layer of high quality having less defects is formed utilizing nickel.

Figure 10A:
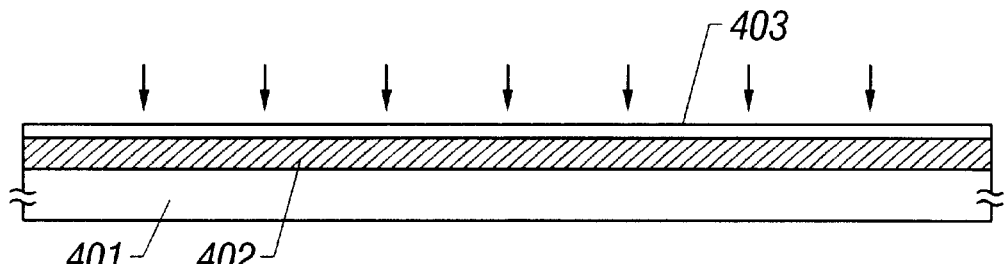
FIGS. 10A through 10E are views showing steps for fabricating a single cystalline silicon layer on a silicon oxide layer utilizing a single crystalline silicon substrate according to the embodiment 9 of the present invention.

First, a single crystalline silicon substrate 401 is formed as shown in FIG. 10A, and oxygen ions are implanted in the single crystalline silicon substrate 101. Here, an ion doping process is used to implant the oxygen ions.

This step is similar to the well-known SIMOX technique. The dose used here is $1 \times 10^{18}/cm^2$. The acceleration voltage is determined based on the position (depth) in which a buried silicon oxide layer is to be formed.

The step of implanting oxygen ions is performed with the temperature of the substrate 401 elevated to 500° C. The purpose is to prevent the oxygen ion implanted from causing damage to the outermost layer of the single crystalline silicon substrate 401 which leads to significant reduction the crystallinity thereof. The temperature is preferably in the range from 400° C. to 600° C.

The implantation of oxygen ions results in the formation of an oxygen ion implantation layer indicated by 402 in the single crystalline silicon substrate 401. At this point, the oxygen ion implantation layer 402 does not consist of $SiO_2$ which is stable. That is, it includes unstably bonded Si—O compounds at a high percentage. Obviously, the oxygen ion implantation layer 402 has a high defect density in this state.

Further, in the state shown in FIG. 10A, a region indicated by 403 (the outermost layer of the single crystalline silicon substrate 401) is a residual silicon layer.

Consideration must be paid when the implanting conditions are set so that the crystallinity of this residual silicon layer 403 is not reduced.

Here, the residual silicon layer 403 includes defects produced as a result of the implantation of oxygen ions. It is assumed to have local damage to crystallinity (which depends on the conditions for the implantation of oxygen ions).

Figure 10B:
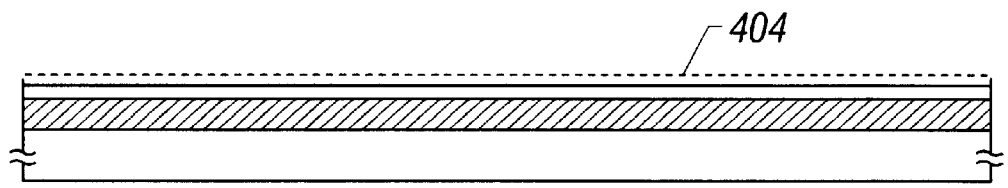

Thus, the state shown in FIG. 10A is realized. Next, nickel is introduced. A solution is used here to introduce nickel. Specifically, a solution of nickel acetate including nickel at a predetermined concentration is applied to achieve a state in which nickel is kept in contact with the surface of the residual silicon layer 403. Thus, a nickel-containing layer 404 is formed as shown in FIG. 10B.

Instead of the method using a solution, nickel may be introduced using various methods such as sputtering, plasma CVD, a plasma process utilizing a nickel-containing electrode (which takes advantage of nickel released from the electrode into the atmosphere), and ion implantation.

However, these methods are unpreferable to the method using a solution from viewpoint of controllability and productivity. The method using a solution is most preferable for processing a large area uniformly.

At subsequent steps, nickel diffuses into the residual silicon layer 403 from the nickel containing layer 404 obtained by the method using a solution as described above.

The amount of nickel that diffuses into the residual silicon layer 403 and the concentration of nickel in the silicon layer 403 after the diffusion of nickel can be determined by adjusting the concentration of nickel contained in the solution of nickel acetate (this is the most significant advantage of the use of such a solution).

Figure 10C:
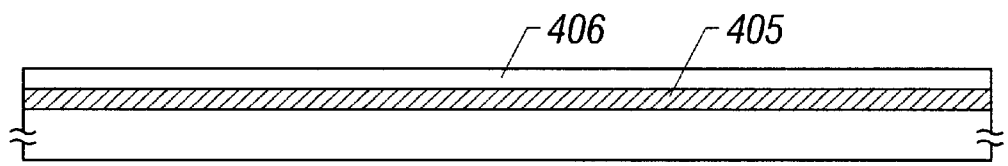

After the introduction of nickel as shown in FIG. 10B, a heating process is performed in a non-oxidizing atmosphere, as shown in FIG. 10C. A non-oxidizing atmosphere is an atmosphere in which substantially (or intentionally) no oxygen is included.

Here, a heating process at 1150° C. is carried out for two hours in a nitrogen atmosphere at a normal pressure. This heating process forms a silicon oxide layer indicated by 405. At the same time, the silicon layer on the silicon oxide layer 405 becomes a single crystalline silicon layer 406.

This heating process is performed at a temperature in the range from about 900° C. to about 1350° C. In general, the temperature is preferably in the range from about 900° C. to about 1200° C. when burdens to the manufacturing apparatus are considered.

In the present embodiment, the thicknesses of the silicon oxide layer 405 and single crystalline silicon layer 406 are 4000 Å and 2000 Å, respectively.

Specifically, the thicknesses of those layers are set at the above-mentioned values by appropriately selecting the conditions for implantation of oxygen ions shown in FIG. 10A, the conditions for introduction of nickel shown in FIG. 10B, and the conditions for heating shown in FIG. 10C (those conditions must be empirically decided).

The present embodiment is characterized in that it is not essential to conduct the above-described heating process at a temperature as high as 1300° C. because nickel is used. In other words, the technique disclosed here is characterized by the fact that the introduction of nickel provides is more effective than a heating process at a temperature as high as 1300° C. or more.

Thus, the state shown in FIG. 10C is achieved. Specifically, a silicon oxide layer 405 is formed and a single crystalline silicon layer 406 is formed thereon. That is, this step forms the silicon oxide layer 405 and transforms the residual silicon layer 403 whose crystallinity has been damaged by the implantation of oxygen ions (as occurs in general) into a single crystalline layer. In this state, nickel is included in the single crystalline silicon layer 406 in a relatively high concentration, and defects are also present as a result of the formation of the silicon oxide layer 405 in a concentration which is not negligible.

When the state shown in FIG. 10C is achieved, another heating process is performed in an oxidizing atmosphere. This heating process is performed at a temperature of 1150° C. in an oxygen atmosphere including 3% HCl by volume at a normal pressure. This step forms a thermal oxidation layer (thermal oxidation film) indicated by 407 to thickness of 1000 Å.

Figure 10D:
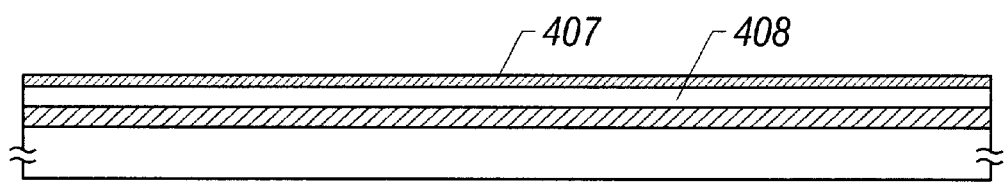

As shown in FIG. 10D, this step provides a single crystalline silicon layer 408 having a thickness of 1500 Å.

At this step, the action of nickel corrects the defects formed when the silicon oxide layer 405 was formed. At the same time, nickel is gettered by the action of chlorine included in the thermal oxidation layer 407.

Further, an observation utilizing SIMS (secondary ion mass spectroscopy) has revealed that this gettering effect results in a tendency of the concentration of nickel in the resultant single crystalline silicon layer 406 to gradually increase toward the surface thereof. This tendency proves the fact that the step utilizing nickel disclosed in this specification has been used.

Although the mechanism that works behind this step has not been clearly identified, the inventors have conceived the following model.

First, at the step shown in FIG. 10C, the single crystalline silicon layer 406 is formed at the same time when the silicon oxide layer 405 which is a buried oxide layer is formed. At this point, defects are formed especially in the vicinity of the interface between the silicon oxide layer 405 and single crystalline silicon layer 406 (the defects primarily concentrate in the single crystalline silicon layer 406 in the vicinity of the interface). This is regarded attributable principally to Si atoms which are present between lattices.

Such interstitial Si atoms further have an effect of forming defects in other regions of the single crystalline silicon layer 406.

When the thermal oxidation layer 407 is formed at the step shown in FIG. 10D, nickel diffuses into the single crystalline silicon layer 406 (which is regarded as not yet formed as a single crystalline silicon layer 408 to be described later).

The action of nickel that has diffused into the single crystalline silicon layer 406 promotes bonding between Si atoms and improves crystallinity.

Further, the nickel that has diffused into the single crystalline silicon layer 406 are bound with oxygen and silicon. This action occurs utilizing above-described interstitial Si atoms. As a result, the interstitial Si atoms are reduced.

Furthermore, Si atoms in the single crystalline silicon layer 406 is utilized for forming the thermal oxidation film 407, so that the interstitial Si atoms are reduced.

As a result, the bonding between silicon atoms is promoted in the single crystalline silicon layer 406 and defects resulting from the presence of interstitial atoms are repaired. Thus, a single crystalline silicon layer 408 is obtained.

At this step for forming the thermal oxidation layer 407, the action of chlorine getters nickel into the thermal oxidation layer 407. Specifically, the nickel which has contributed to the improvement of crystallinity and reduction of defects is gettered into the thermal oxidation layer 407.

Thus, there is provided a single crystalline silicon layer 408 having a reduced defect density. In this state (the state shown in FIG. 10D), the thermal oxidation layer 407 includes nickel at a high concentration which has been gettered thereto.

Figure 10E:
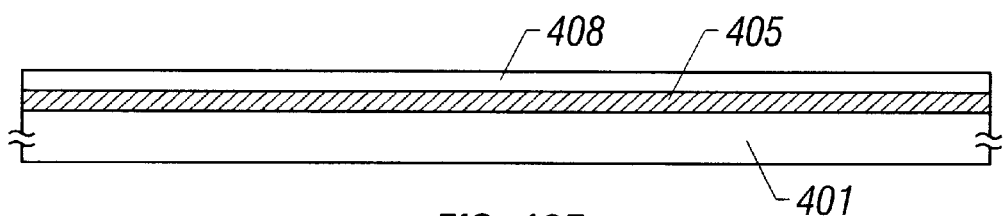

Then, the thermal oxidation layer 407 is removed as shown in FIG. 10E. Thus, a single crystalline silicon layer 408 of high quality having a low defect density is obtained.

Desired devices are formed thereafter utilizing this single crystalline silicon layer 408 according to a known method.

The thickness of each layer may be appropriately determined by a combination of conditions at each of the steps. That is, the thicknesses of the layers may be set as needed by changing such conditions which are not limited to the description given above.

Embodiment 10

FIGS. 11A through 11E show fabrication steps according to the present embodiment. Conditions for such steps are similar to those in the embodiment 9 (see FIGS. 10A through 10E) unless otherwise specified. The reference numerals identical to those in FIGS. 10A through 10E indicate components identical to those in the embodiment 9.

Figure 11A:
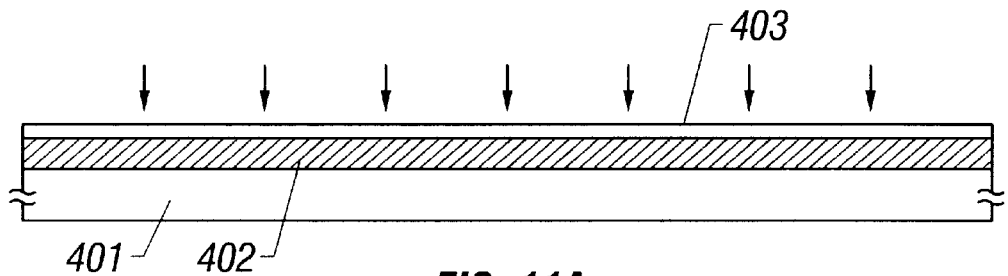
FIGS. 11A through 11E are views showing steps for fabricating a single crystalline silicon layer on a silicon oxide layer utilizing a single crystalline silicon substrate according to the embodiment 10 of the present invention.

First, as shown in FIG. 11A, oxygen ions are implanted in a single crystalline silicon substrate 401 to form an oxygen ion implantation layer 402. This step forms a residual silicon layer 403 having a thickness of 2000 Å.

Next, a heating process at 1150° C. is performed in a non-oxidizing atmosphere (which is a nitrogen atmosphere in this case) to transform the oxygen ion implantation layer 402 into a silicon oxide layer 405 having a thickness of 4000 Å.

Figure 11B:
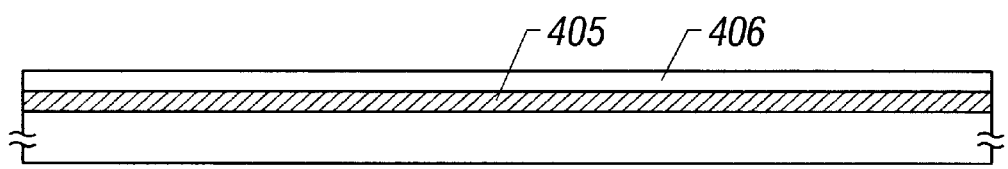

A single crystalline silicon layer 406 is also formed in this heating step. Thus, the state shown in FIG. 11B is achieved.

At this point, a single crystalline silicon layer 406 still in a preliminary state has been formed on the silicon oxide layer 405. This state corresponds to a state which has been known as "SIMOX structure". In this state, the single crystalline silicon layer 406 includes defects in a density which is not negligible.

Figure 11C:
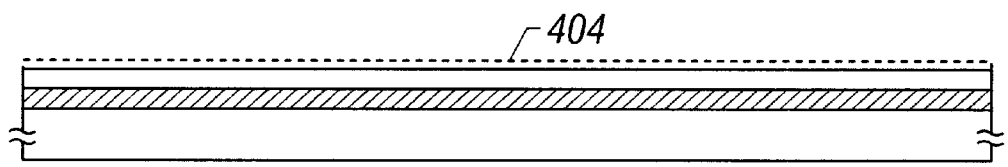

Next, the introduction of nickel is performed, which is characteristic of the present invention. A solution of nickel acetate prepared to have a predetermined concentration is applied here to form a nickel-containing layer indicated by 104. Thus, the state shown in FIG. 11C is achieved.

Next, a thermal oxidation layer 407 is formed. A heating process at 1150° C. is performed here in an oxygen atmosphere including 3% HCl to form the thermal oxidation layer 407 to a thickness of 1000 Å. This step transforms the single crystalline silicon layer 406 into a single crystalline silicon layer 408 having higher quality.

Figure 11D:
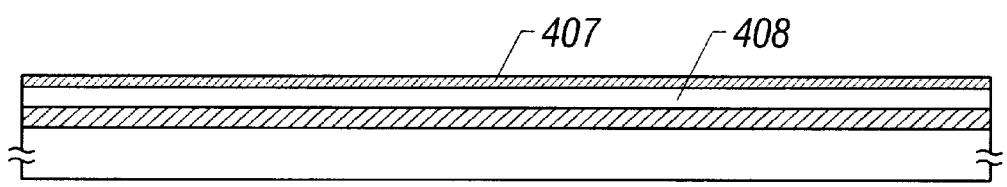

In the single crystalline silicon layer 408 obtained in this step, defects have been reduced as a result of the formation of the thermal oxidation layer and the action of nickel. Further, the action of chlorine (contained in the atmosphere for forming the thermal oxidation layer) results in gettering of nickel into the thermal oxidation layer 407. Thus, the state shown in FIG. 11D is realized.

Figure 11E:
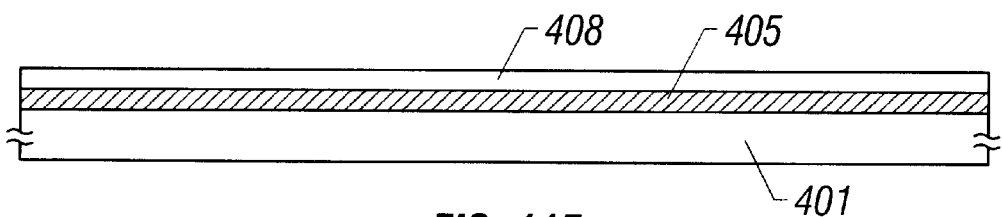

Next, the thermal oxidation layer 407 is removed, which results in the state shown in FIG. 11E.

Embodiment 11

FIGS. 12A through 12D show fabrication steps according to the present embodiment. Conditions and parameters are the same as those in the embodiment 9 unless otherwise specified.

Figure 12A:
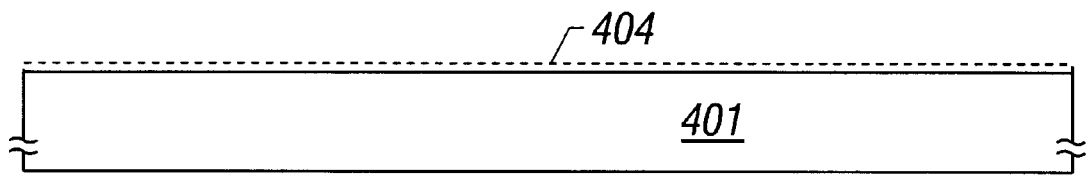
FIGS. 12A through 12D are views showing steps for fabricating a single crystalline silicon layer on a silicon oxide layer utilizing a single crystalline silicon substrate according to the embodiment 11 of the present invention.

First, as shown in FIG. 12A, a solution of nickel acetate is applied to a single crystalline silicon substrate 401 to form a nickel containing layer 404.

Figure 12B:
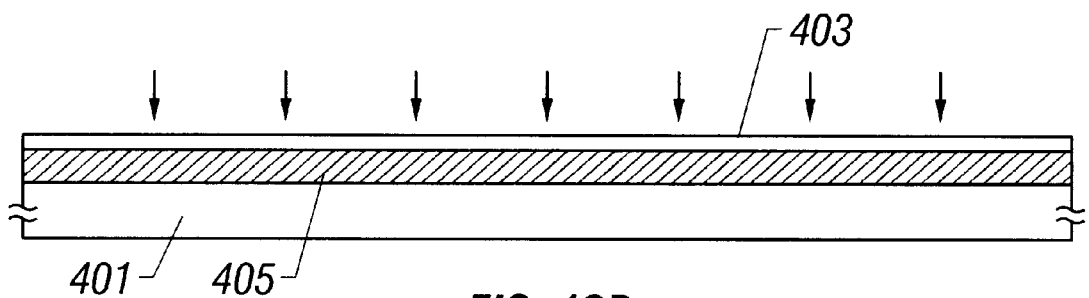

Next, oxygen ions are implanted in the single crystalline silicon substrate 401 to form an oxygen ion implantation layer 405. At this step, a residual silicon layer 403 is formed on a surface of the single crystalline silicon substrate 401. Thus, the state shown in FIG. 12B is achieved.

Figure 12C:
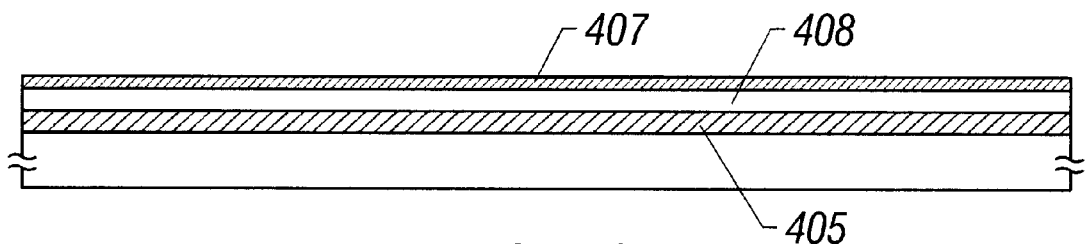

Next, a heating process is performed in an oxidizing atmosphere (an oxygen atmosphere including 3% HCl) to form a thermal oxidation layer 407. This step provides a silicon oxide layer 405 and a single crystalline silicon layer 408. Thus, the state shown in FIG. 12C is achieved.

Figure 12D:
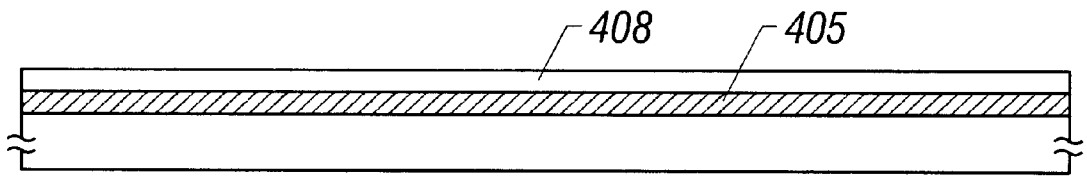

Next, the thermal oxidation layer 407 is removed to provide the state shown in FIG. 12D.

Embodiment 12

FIGS. 13A through 13D show fabrication steps according to the present embodiment. Conditions and parameters are the same as those in the embodiment 9 unless otherwise specified.

Figure 13A:
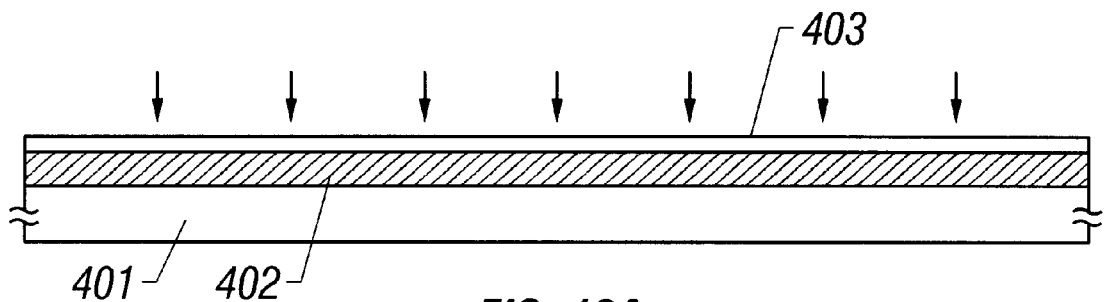
FIGS. 13A through 13D are views showing steps for fabricating a single crystalline silicon layer on a silicon oxide layer utilizing a single crystalline silicon substrate according to the embodiment 12 of the present invention.

First, as shown in FIG. 13A, oxygen ions are implanted to form an oxygen ion implantation layer 402 in a single crystalline silicon substrate 401. In this state, a residual silicon layer 403 is formed.

Figure 13B:
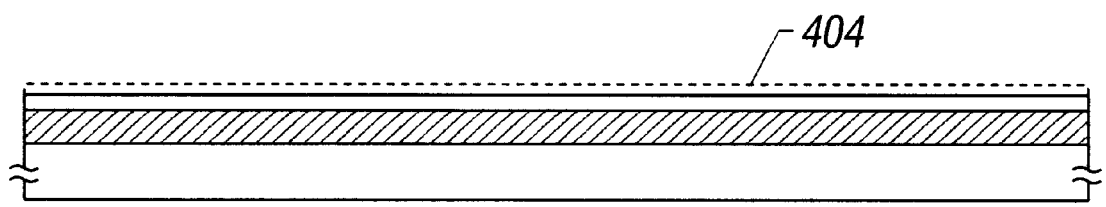

Next, as shown in FIG. 13B, a solution of nickel acetate is applied to form a nickel containing layer 404.

Figure 13C:
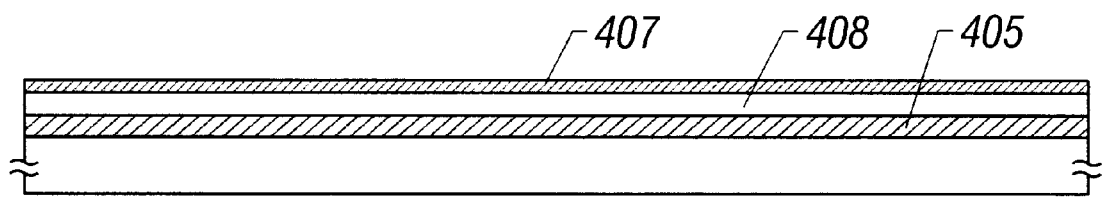

Next, a heating process is performed in an oxidizing atmosphere (an oxygen atmosphere including 3% HCl) to form a thermal oxidation layer 407. This step forms a silicon oxide layer 405 and a single crystalline silicon layer 408. Thus, the state shown in FIG. 13C is achieved.

Figure 13D:
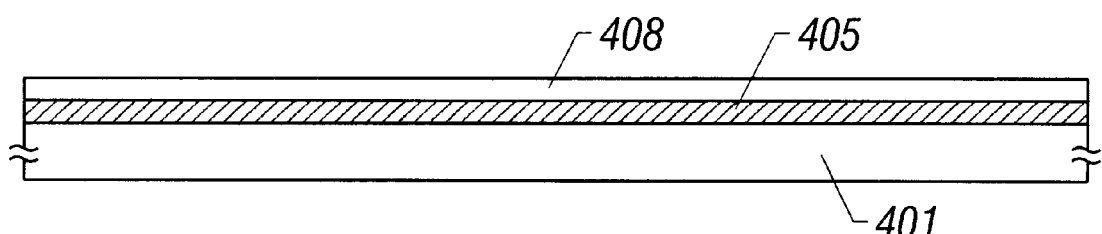

Next, the thermal oxidation layer 407 is removed to provide the state shown in FIG. 13D.

Embodiment 13

The present embodiment shows steps for fabricating an N-channel type transistor that forms a part of an integrated circuit utilizing the present invention.

Figure 14A:
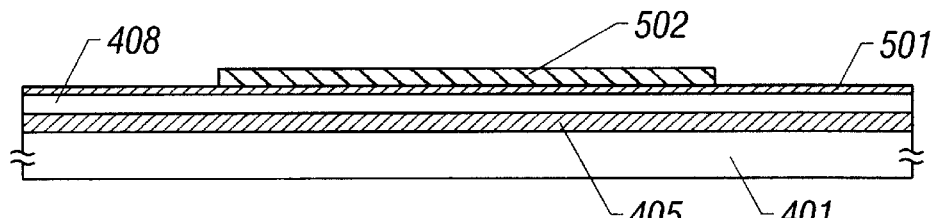
FIGS. 14A through 14E are views showing steps for fabricating an insulated-gate filed effect transistor utilizing a single crystalline silicon layer according to the embodiment 13 of the present invention.
Figure 14B:
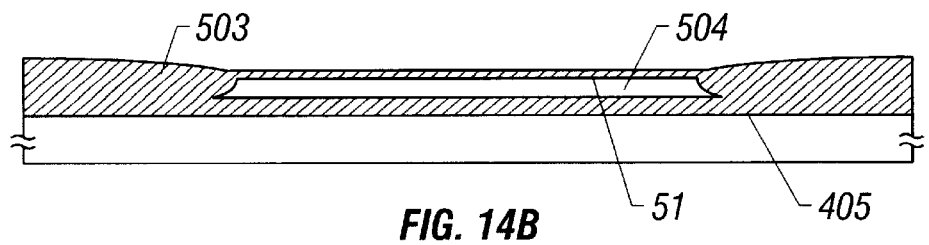
Figure 14C:
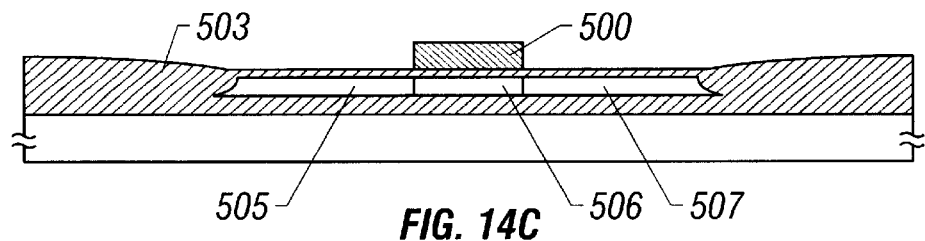
Figure 14D:
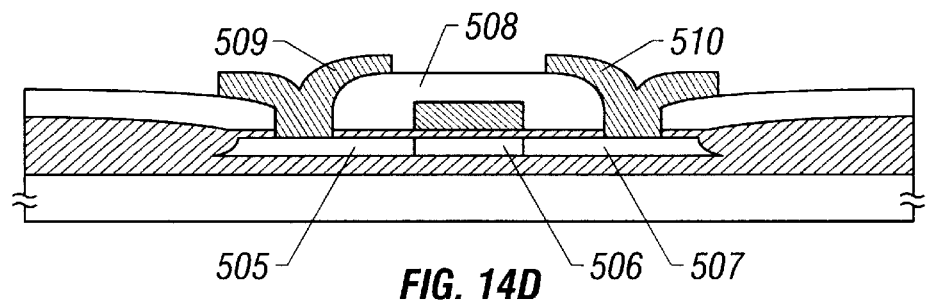
Figure 14E:
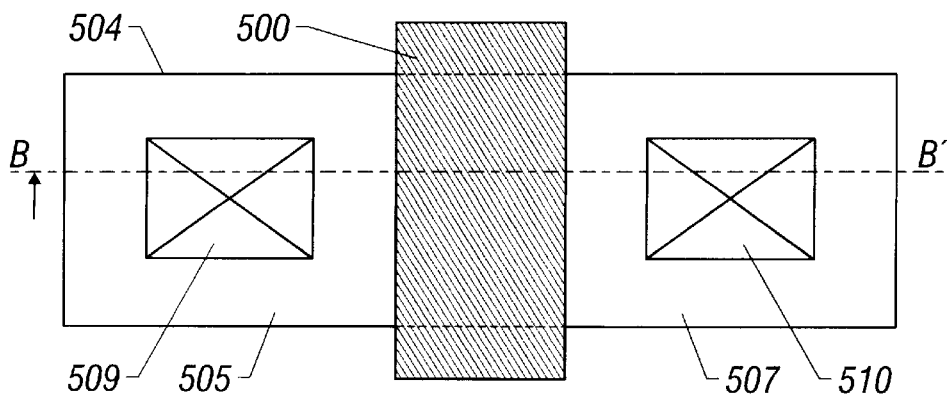

FIGS. 14A through 14E show fabrication steps according to the present embodiment. FIG. 14D is a sectional view of a transistor (insulated gate type field effect transistor) described in the present embodiment. FIG. 14E is a plan view of the thin film transistor shown in FIG. 14D. FIG. 14D is a section taken along the line B-B' in FIG. 14E.

Steps for fabricating the transistor shown in FIGS. 14D and 14E will now be described. First, as shown in FIG. 14A, a single crystalline silicon layer 408 is formed on a single crystalline substrate 401 using the method as described in the embodiments 9 through 12. In FIG. 14A, a reference numeral 405 designates a silicon oxide layer formed as a result of implantation of oxygen ions followed by annealing.

Next, a thermal oxidation layer (thermal oxidation film) 501 is formed to a thickness of 100 Å. This thermal oxidation layer 501 may be formed using a normal method.

A mask pattern indicated by 502 is then formed from a silicon nitride film. Thus, the state shown in FIG. 14A is achieved.

Next, another thermal oxidation process is performed to form a field oxide layer indicated by 503 (a selective oxide layer for two-dimensional separation of devices). This step is basically the same as that is generally known as "LOCOS (local oxidation of silicon) process".

It should be noted that the field oxide film 503 is formed such that the single crystalline silicon layer 408 will not remain in regions where device separation is to be carried out. Specifically, the single crystalline silicon layer 408 is completely separated and isolated by the field oxide layer 503. This is a difference from the LOCOS (local oxidation of silicon) process in the prior art IC technique.

Thus, a single crystalline silicon layer 504 surrounded by silicon oxide is obtained as shown in FIG. 14B. Specifically, at this point, there is provided a single crystalline silicon layer 504 which is completely insulated (isolated) from the outside by the silicon oxide.

What is important here is that the single crystalline silicon layer 504 is completely insulated from the single crystalline silicon substrate 401 to make it possible to significantly mitigate the problem of capacitive coupling through the substrate which has been encountered in conventional ICs. Thereafter, the active layer of a transistor is configured from this single crystalline silicon layer 504.

Next, the mask 502 constituted by a silicon nitride film is removed. Then, the thermal oxidation layer 501 is removed and another thermal oxidation process is performed to form a thermal oxidation film 51 which will serve as a gate insulation film.

Further, a gate electrode 500 is formed from an appropriate metal, metal silicide or silicon which has been subjected to heavy doping of N-type heavy doping.

By implanting P (phosphorous) ions in this state, a source region 505 and a drain region 507 are formed in a self-alignment manner. This step also defines a channel region 506 in a self-alignment manner.

When the implantation of P ions is complete, a heating process at 900° C. is performed to activate the source region 505 and drain region 507. Thus, the state shown in FIG. 14C is achieved.

When the state shown in FIG. 14C is achieved, a silicon oxide film 508 is formed using a plasma CVD process as an interlayer insulation film. Further, contact holes are formed, and a source electrode 509 and a drain electrode 510 are formed from an appropriate metal material.

Thus, a transistor is formed which utilizes the single crystalline silicon layer 504 formed on an insulation layer (silicon oxide layer) as the active layer.

A transistor having such a structure is characterized in that it can operate at a high speed because the capacity between itself and the substrate can be reduced. It is further characterized in that it is less affected by capacitive coupling between adjacent devices and wiring through the substrate.

Although steps for fabricating an N-channel type transistor have been described in the present embodiment, a P-type transistor can be obtained from the same steps by changing the impurities for providing the conductivity type.

Embodiment 14

The present embodiment concerns steps for fabricating a transistor having a low concentration impurity region which is effective in suppressing deterioration due to the hot carrier effect. Such a low concentration impurity region has a function of achieving a gradual distribution of impurities for improving the withstand voltage across the source and drain, especially, across the channel and drain and moderating the field strength across the channel and drain.

Figure 15A:
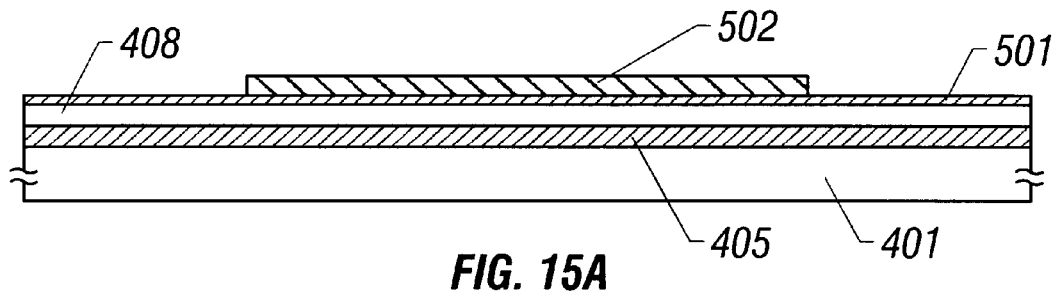
FIGS. 15A through 15D are views showing steps for fabricating an insulated-gate filed effect transistor having a low concentration impurity region utilizing a single crystalline silicon layer according to the embodiment 14 of the present invention.

FIGS. 15A through 15D show fabrication steps according to the present embodiment. First, as shown in FIG. 15A, a single crystalline silicon layer 408 is formed on a single crystalline silicon substrate 401 through a silicon oxide layer 405 in accordance with the fabrication steps shown in the embodiments 9 through 12.

Then, a thermal oxidation film 502 is formed, and a mask pattern constituted by a silicon nitride film 502 is further formed. Thus, the state shown in FIG. 15A is achieved.

By performing another thermal oxidation process with the mask pattern 502 left in place, a field oxide film indicated by 503 is formed. This step provides a single crystalline silicon layer 504 which is surrounded by the silicon oxide layer on the upper, lower and lateral sides thereof to be electrically and physically isolated. This single crystalline silicon layer 504 will serve as the active layer of a transistor.

Figure 15B:
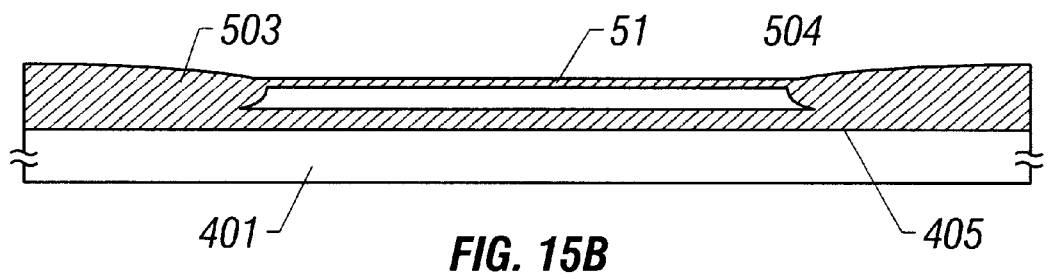

Next, the mask pattern constituted by the silicon nitride film 502 and the thermal oxidation layer 501 are removed, and another thermal oxidation process is performed to form a thermal oxidation layer 51 which will serve as the gate insulation film. Thus, the state shown in FIG. 15B is achieved.

Further, a gate electrode 500 is formed from an appropriate metal material or a silicide material. This step may be carried out using a common technique employed for ICs.

P ions are implanted after the gate electrode 500 is formed. Since this is a step for forming a low concentration impurity region, P ions are implanted at a dose lower than that used for forming general source and drain regions. The ions may be implanted using an ion implantation process.

Next, a silicon oxide film 601 is formed using a plasma CVD process. This silicon oxide film 601 is used for forming side wall spacers for forming the low concentration impurity region. The silicon oxide film 601 is preferably formed using a means which provides excellent step coverage.

Figure 15C:
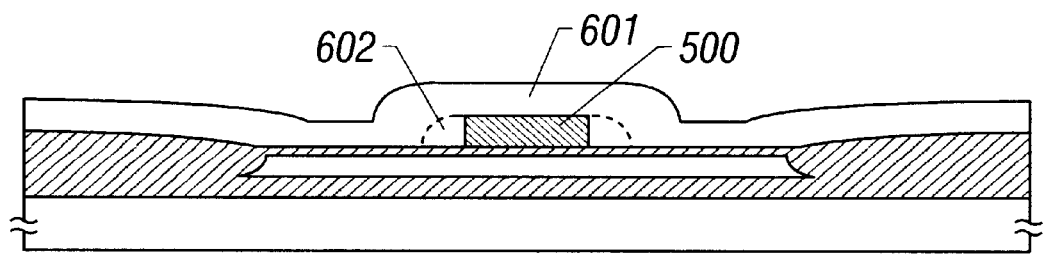

When the silicon oxide film 601 is formed, the state shown in FIG. 15C is achieved. In this state, an etching process which is anisotropic in the vertical direction (preferably an RIE process) is performed to etch the silicon oxide film 601 in the vertical direction from the surface thereof As a result, the silicon oxide material remains on the sides of the gate electrode 500 as indicated by 602. The regions where the silicon oxide material remains are referred to as "side wall spacers".

Impurity ions are implanted in this state. P (phosphorous) ions are implanted here to fabricate an N-channel type insulated gate field effect transistor. The conditions for the implantation of P ions are the same as the conditions adopted when normal source and drain regions are formed.

Therefore, the doping at this step involves a dose which is greater than that employed in the light doping performed before the formation of the side wall spacers at the regions indicated by 602.

As a result of the implantation of P ions described above, regions indicated by 603 and 607 in FIG. 15D are formed as a source region and a drain region, respectively. Those regions are referred to as "high concentration impurity regions ($N^+0$ type regions) because they are doped with P in a concentration higher than that in the regions 604 and 606 which are referred to as "low concentration regions".

Further, P ions are not implanted in a region indicated by 605 because of the presence of the gate electrode 500, and this region defines a channel region.

After the step of implanting impurity ions to form the source region 603 and drain region 607, a heating process is conducted to activate the implanted P ions and to anneal any damage which has occurred during the ion implantation.

Next, a silicon oxide film 508 (which may be a silicon nitride film instead) is formed as an interlayer insulation film, and contact holes are formed to form a source electrode 509 and a drain electrode 510.

Figure 15D:
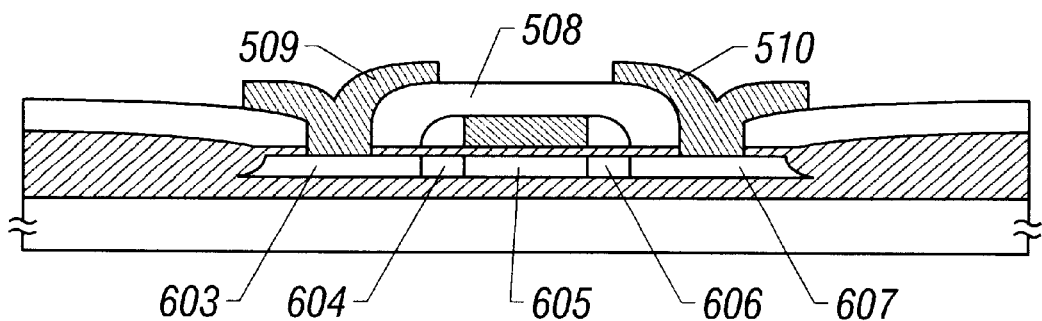

In the configuration shown in FIG. 15D, the low concentration impurity region on the side of the drain region 607 indicated by 606 is generally referred to as an LDD (lightly doped drain) region.

Embodiment 15

The present embodiment concerns a configuration in which the density of levels formed on a side of an active layer is reduced. The formation of the field oxide layer 503 for device separation by the step as shown in FIG. 14B is likely to result in the formation of levels in a region indicated by 702 in FIG. 16B. Specifically, defects are likely to be formed on a side of the single crystalline silicon layer 504 which is to serve as an active layer.

In this region, a portion where the leading edge of the field oxide film 503 under oxidation in progress, the silicon oxide layer 405 and the single crystalline silicon layer 504 remaining in a predetermined pattern are adjacent to each other. Therefore, this region (the region indicated by 702) is likely to be subjected to states such as the occurrence of interstitial atoms as a result of oxidation and abnormal bonding of silicon atoms.

Specifically, an imperfectly bonded layer expressed by $SiO_X$ (0<X<2) is formed at the interface between the single crystalline silicon layer 504 and field oxide layer 503. The thickness of the imperfectly bonded layer expressed by $SiO_X$ (0<X<2) is assumed to be on the order of 10 to 20 Å or less.

The presence of such a layer defect leads to an undesirable phenomenon referred to as "narrow channel effect". This is a phenomenon in which carriers move 0 not only through the channel but also by way of such a $SiO_X$ (0<X<2) present on a side of the active layer (i.e., by way of a level in the layer).

This phenomenon can cause problems including deterioration of the characteristics of the transistor, reduction in the stability of the transistor characteristics, and reduced high frequency characteristics.

The present embodiment provides a technique to solve the above-described problem. FIGS. 16A through 16D show a part of steps for fabricating a transistor according to the present embodiment.

A single crystalline silicon layer 40 is provided in accordance with the steps described in the embodiments 9 through 12. Then, a thermal oxidation layer 501 and a mask pattern constituted by a silicon nitride film 502 are formed to achieve the state shown in FIG. 16A.

Figure 16A:
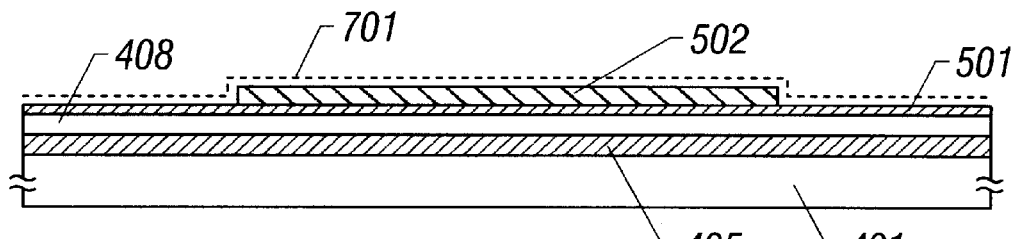
FIGS. 16A through 16D are views showing steps for fabricating an insulated-gate filed effect transistor utilizing a single crystalline silicon layer according to the embodiment 15 of the present invention.

According to the present embodiment, at this point, a nickel containing layer is formed as indicated by 701. A solution of nickel acetate prepared in a predetermined concentration is applied here using a spin coat process to form the nickel containing layer 701. Thus, the state shown in FIG. 16A is achieved.

Figure 16B:
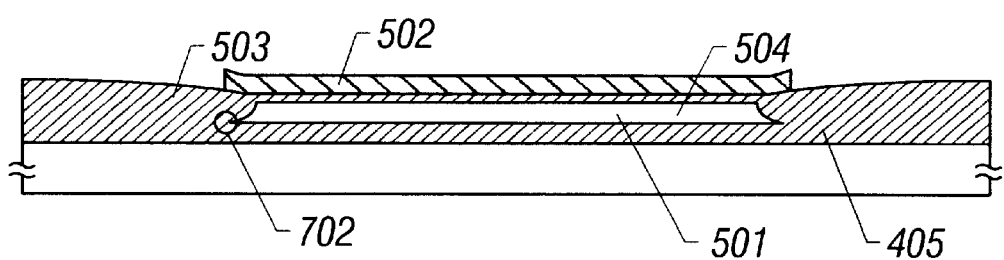
Figure 16C:
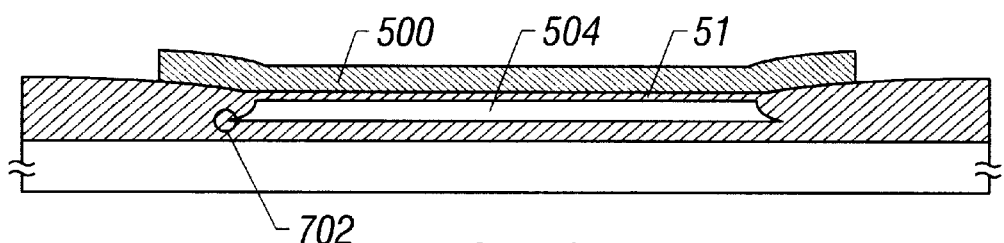
Figure 16D:
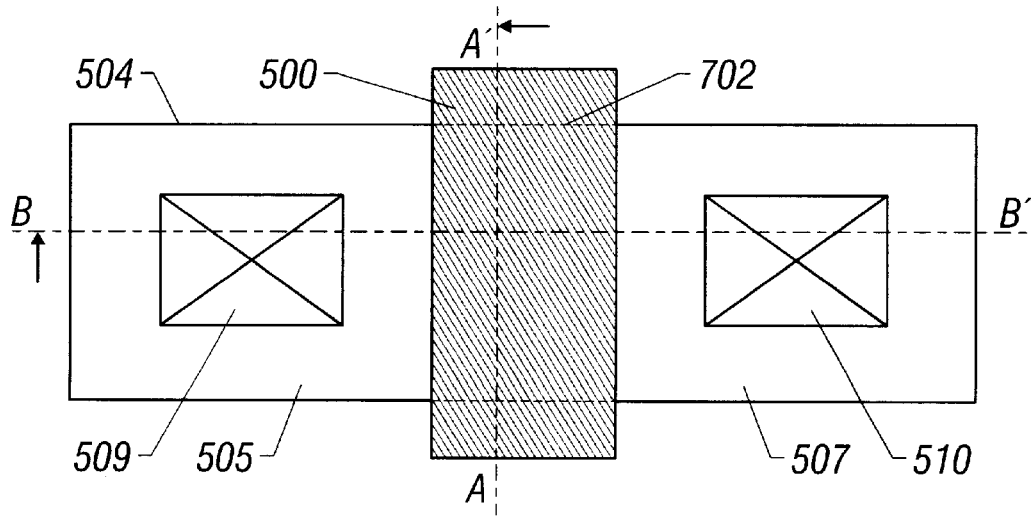

The present embodiment will show steps for fabricating the section taken along the line A-A' in FIG. 16D. FIG. 16D corresponds to FIG. 14E.

Next, thermal oxidization is performed to form a field oxide layer 503 used for device separation (FIG. 16B).

At this point, the action of nickel promotes the bonding between oxygen and silicon in a region indicated by 702. In other words, any layer which is electrically unstable expressed by $SiO_X$ (0<X<2) is removed or made ineffective even if it is present. Thus, the state shown in FIG. 16B is achieved.

Next, the silicon nitride film 502 and the thermal oxidation layer 501 are removed. Then, a thermal oxidation layer 51 to serve as a gate insulation film is formed and, further, a gate electrode 500 is formed. Thus, the state shown in FIG. 16C is realized.

Since the sections taken along the line A-A' in FIG. 16D are shown here, the source region 505 and the drain region 507 are not shown in FIG. 16C.

The section shown in FIG. 16C corresponds to the section shown in FIG. 14C. The difference between those sections result from where they are taken. Specifically, the former is taken along the line A-A' in FIG. 16D while the latter is taken along the line B-B'.

When the state shown in FIG. 16C is achieved, a transistor is fabricated in accordance with the steps shown starting with FIG. 14D.

The use of the configuration described in the present embodiment makes it possible to suppress the formation of defects at a side of an active layer. It is therefore possible to suppress the occurrence of problems such as deterioration of the characteristics of a transistor, reduction in the stability of transistor characteristics, an increase in the OFF current, and deterioration of high frequency characteristics.

Figure 17:
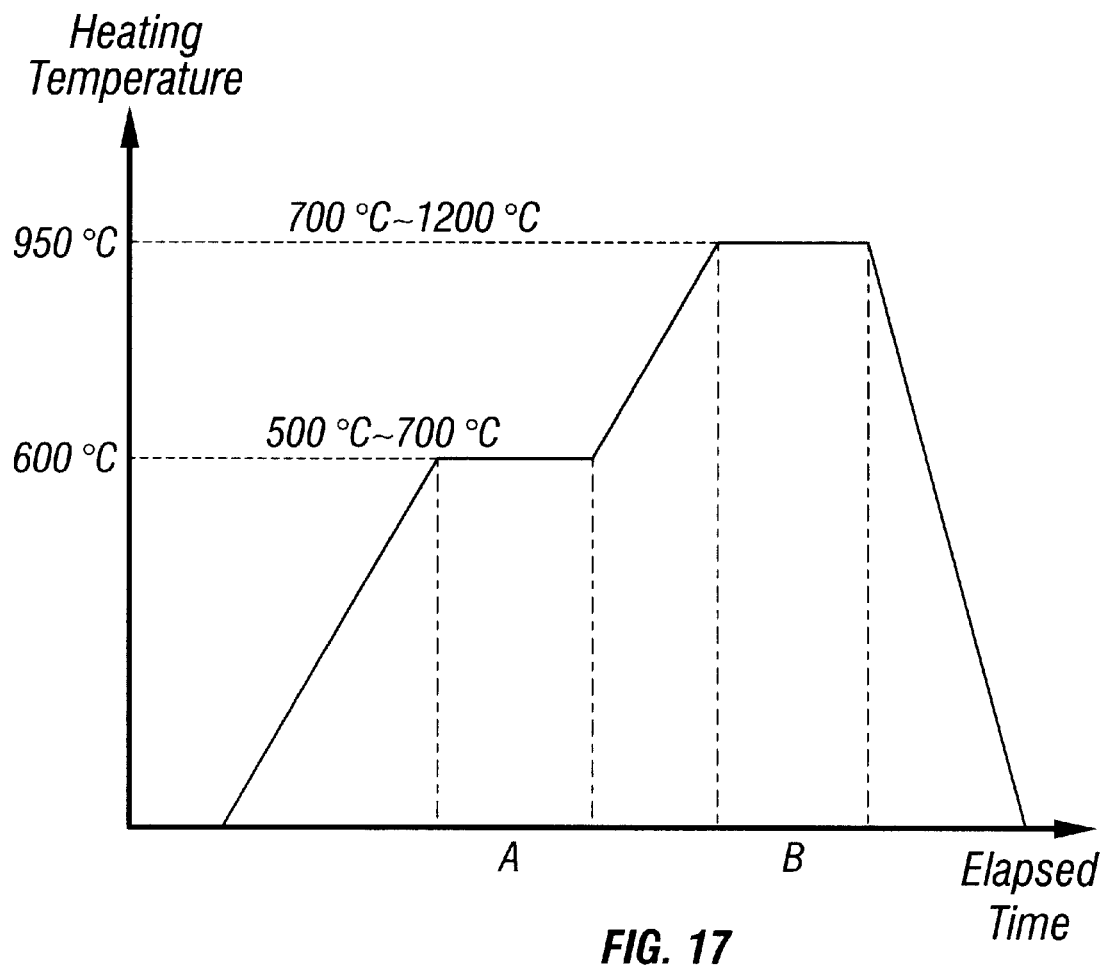
FIG. 17 is a graph showing a state of heating according to the embodiment 15 of the present invention.

FIG. 17 shows an example of the relationship between the temperatures and timing for the heating employed to implement the configuration described in the present embodiment.

In the case illustrated in FIG. 17, nickel is diffused in the area indicated by A and thermal oxidation occurs in the area indicated by B.

Embodiment 16

Figure 18A:
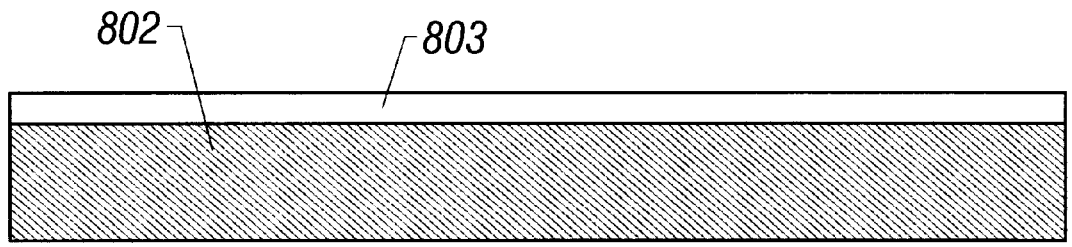
FIGS. 18A through 18C are views showing steps for fabricating a bipolar transistor utilizing a single crystalline silicon layer according to the embodiment 16 of the present invention.
Figure 18B:
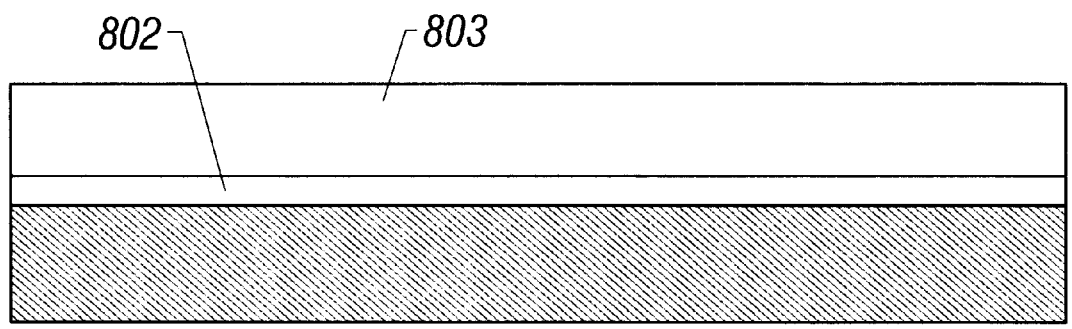
Figure 18C:
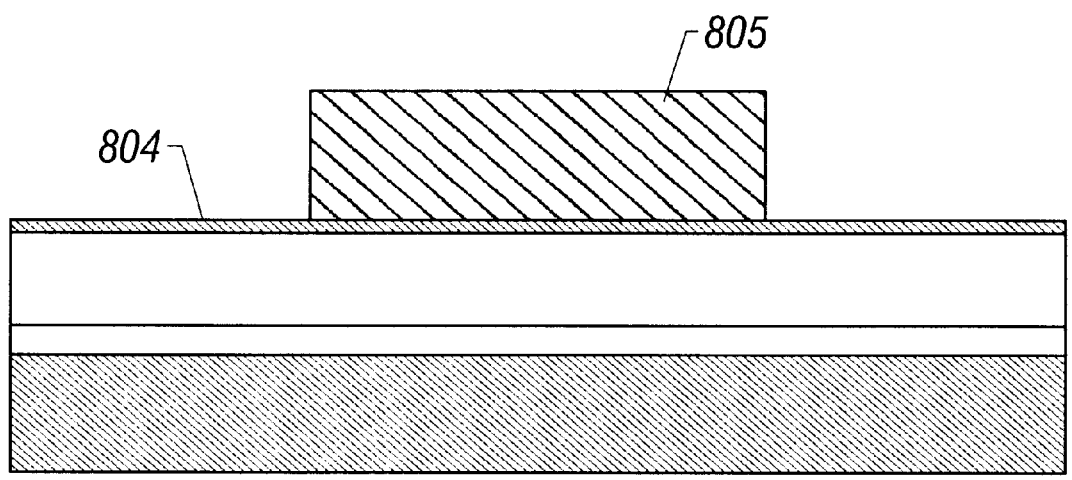

The present embodiment shows an example wherein a bipolar transistor is fabricated. FIGS. 18A through 18C show the fabrication steps according to the present embodiment. First, an N+ type single crystalline silicon layer 802 is formed on a silicon oxide layer 801 using the fabrication steps described in the embodiments 9 through 12. Although not shown, a single crystalline silicon substrate underlies the silicon oxide layer. Thus, the state shown in FIG. 18A is realized.

The present embodiment utilizes a N+ type single crystalline silicon layer 802 formed using the fabrication steps described in the embodiments 1 through 12.

P or As is implanted in a single crystalline silicon substrate as a starting material so as to obtain the desired conductivity type and the desired level of conductivity. Alternatively, a single crystalline silicon substrate which has been originally provided with N+ type properties is used.

If an N+ type layer is selectively formed in the single crystalline silicon substrate, the present embodiment can be implemented in combination with the configuration described in the embodiment 13. That is, an insulated gate type field effect transistor can be fabricated on the same substrate.

Next, a known epitaxial growth process is used to grow an N-type single crystalline silicon layer 803. A bipolar transistor is formed using the N-type single crystalline silicon layer 803 as the active layer. Thus, the state shown in FIG. 18B is achieved.

Next, a thermal oxidation layer 804 is formed, and a mask pattern 805 for forming a field oxide layer for device separation (formed by selective thermal oxidation) is formed of a silicon nitride film. Thus, the state shown in FIG. 18C is achieved.

Figure 19A:
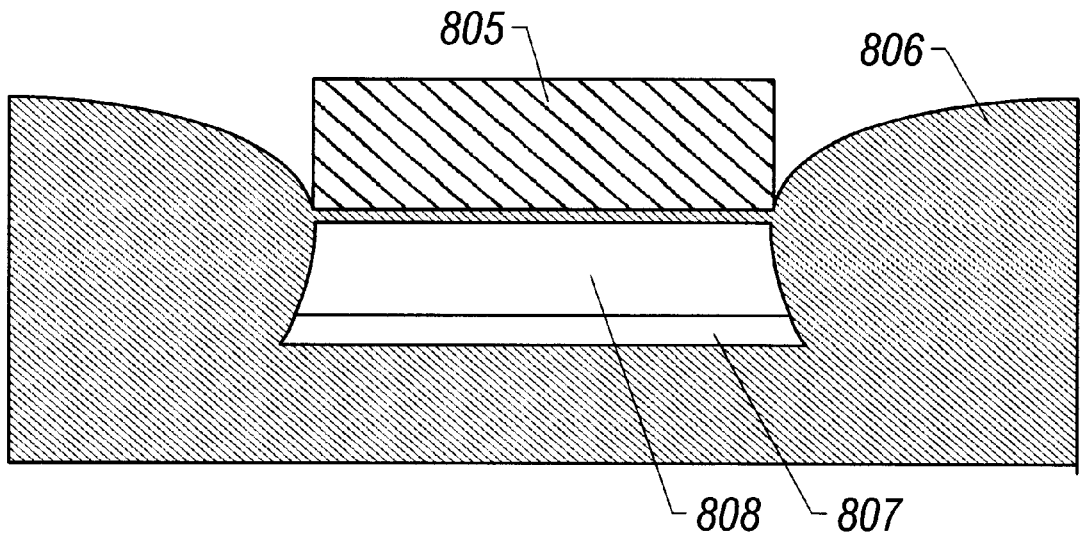
FIGS. 19A and 19B are views showing steps for fabricating a bipolar transistor utilizing a single crystalline silicon layer according to the embodiment 16 of the present invention.

Thermal oxidation is then performed to form a field oxide film 806 as shown in FIG. 19A. This step results in a state wherein a layered pattern consisting of the N+ type single crystalline silicon layer 807 and the N-type single crystalline silicon layer 808 is isolated in the silicon oxide film.

When the state shown in FIG. 19A is achieved, the silicon nitride film pattern 805 is removed. Impurities are selectively diffused to form an NPN-type bipolar transistor as shown in FIG. 19B.

Figure 19B:
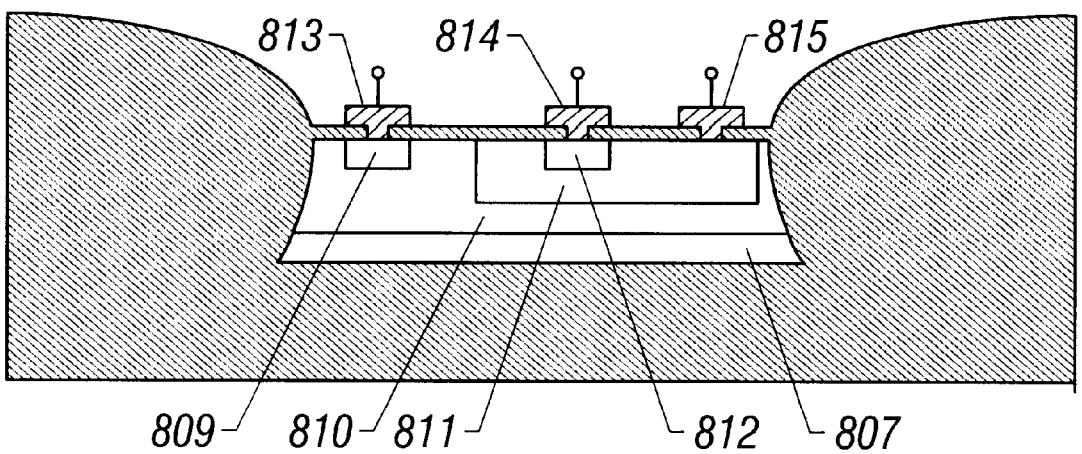

In FIG. 19B, 812 designates an N+-type emitter region; 809 designates an N+-type collector region; 811 designates a P-type base region; and 810 designates an N-type region which conducts carriers moving toward the collector. 807 designates an N+-type region referred to as "buried layer" for facilitating the conduction of carriers to the collector. Further, reference numerals 813, 814, 815 denote a collector, an emitter and a base, respectively.

Although an example of the formation of a single bipolar transistor has been described, it is possible to form an insulated gate type field effect transistor in the same substrate. In addition, a variety of resistors and capacitors may be formed.

Embodiment 17

Figure 20A:
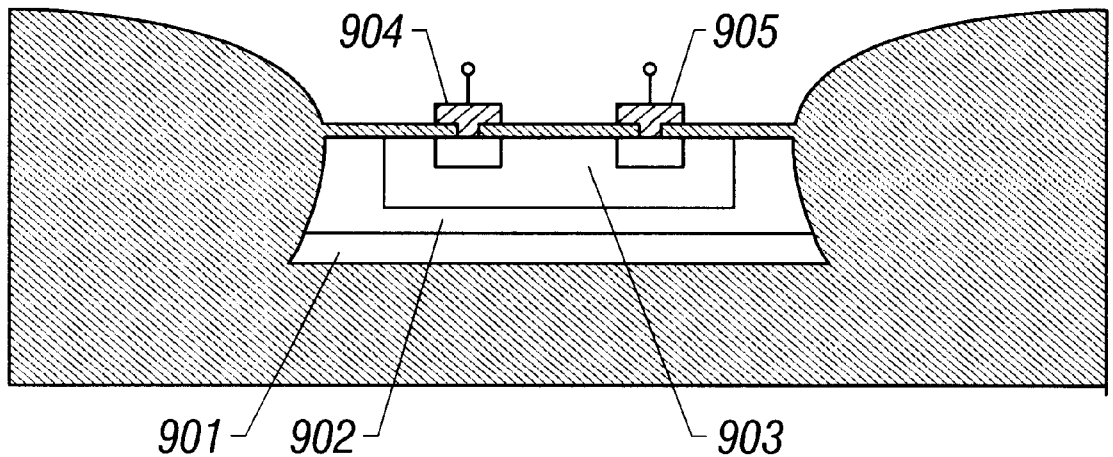
FIGS. 20A and 20B respectively show a resistor and a capacitor fabricated utilizing a single crystalline silicon layer according to the embodiment 17 of the present invention.
Figure 20B:
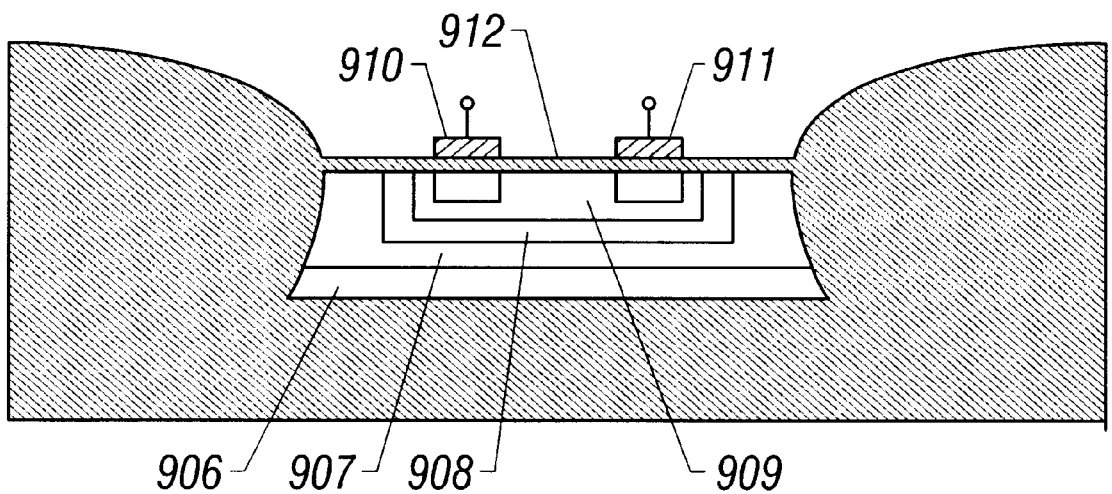

The present embodiment shows an example wherein a resistor and a capacitor are formed simultaneously at the step described in the embodiment 16. FIG. 20A shows an example of the structure of the resistor. FIG. 20B shows an example of the structure of the capacitor.

The resistor shown in FIG. 20A utilizes a P-type diffusion layer 903 as an resistive element. Specifically, it has a structure in which the P-type diffusion layer is used as a resistive element between electrodes 904 and 905.

An N+-type layer 901 and an N-type layer 902 formed using epitaxial growth do not perform any particular function in the structure shown in FIG. 20A.

The capacitor shown in FIG. 20B has a MOS (metal-oxide-semiconductor) structure in which a thermal oxidation film 912 is used as a dielectric element. Specifically, a capacitor is formed by employing a structure in which the thermal oxidation film 912 is interposed by an electrode 910 made of a metal and an N+-type semiconductor layer 909.

A P-type semiconductor layer 908, an N-type semiconductor layer 907 and an N+-type semiconductor layer 906 do not perform any particular function in this structure.

The present embodiment may be implemented in combination with the configuration of any other embodiment of the invention to allow an integrated circuit having desired functions to be formed in the same single crystalline silicon substrate (on the surface of the substrate).

Since each of devices (active and passive devices) in such an integrated circuit is completely (electrically and physically) separated from others by an insulator (silicon oxide), a configuration can be achieved which provides a high separation withstand voltage and in which mutual interference is extremely small. Especially, capacitive coupling through the substrate can be significantly reduced.

This significantly improves the reliability of such an integrated circuit itself and an apparatus employing such an integrated circuit. In addition, such a configuration is quite advantageous for circuits for signal processing and the like because it provides excellent high frequency characteristics.

The use of the configurations described in the embodiments 9 through 12 and/or the configuration of FIGS. 16A through 16D of the embodiment 15 makes it possible to reduce the defect density in a single crystalline silicon layer that constitutes the active layer of a device and/or in the vicinity of the interface between itself and its neighbors. This also greatly contributes to the high speed operations and reliability of a device.

Embodiment 18

The present embodiment shows an example of fabrication of a CMOS circuit which is basic circuit configuration for forming an integrated circuit. FIGS. 21A through 21E show the fabrication steps according to the present embodiment.

Figure 21A:
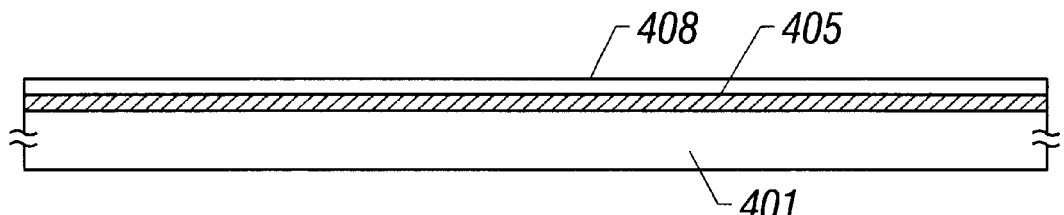
FIGS. 21A through 21E are views showing steps for fabricating a CMOS device according to the embodiment 18 of the present invention.

First, a silicon oxide layer 405 is formed on a single crystalline silicon substrate 401 and a single crystalline silicon layer 408 is formed thereon. This step is similar to those in other embodiments. Thus, the state shown in FIG. 21A is achieved.

Figure 21B:
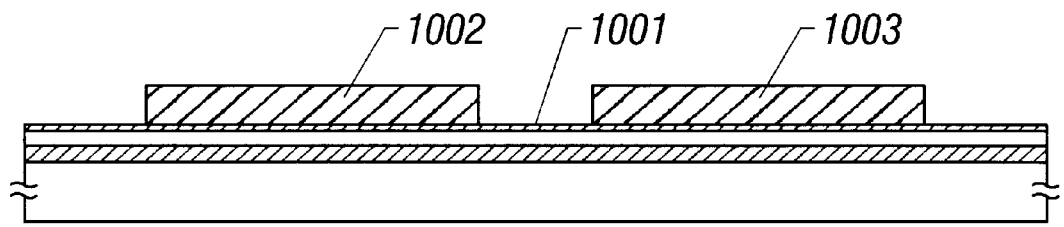

Next, a thermal oxidation film 1001 is formed. Further, regions where an N-channel type transistor (insulated gate type field effect transistor) and a P-channel type transistor (insulated gate type field effect transistor) are to be formed are masked with silicon nitride films 1002 and 1003. Thus, the state shown in FIG. 21B is achieved.

A thermal oxidation process is then performed to form a field oxide film 1004, thereby providing isolated single crystalline silicon layers 1005 and 1006.

The layer 1005 is an active layer that forms a part of an N-channel type transistor. The layer 1006 is an active layer that forms a part of a P-channel type transistor.

Figure 21C:
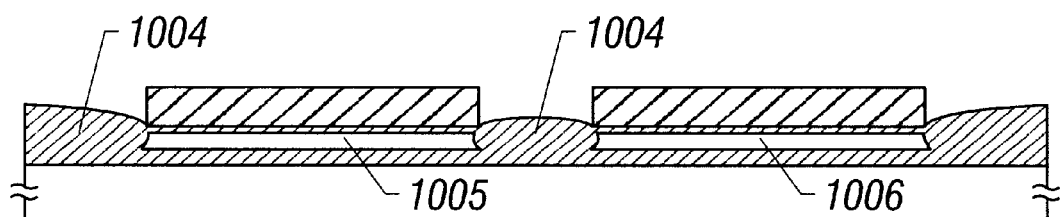

Thus, the state shown in FIG. 21C is achieved. Next, the patterns 1002 and 1003 constituted by a silicon nitride film are removed and, further, a thermal oxidation film 1001 is removed.

Then, thermal oxidation films 1007 and 1008 are formed again. These thermal oxidation films serve as the gate electrodes of the N- and P-channel type transistors, respectively.

Next, gate electrodes 1009 and 1010 are formed. Each of the transistor portions is masked with a resist, and impurity ions are implanted to provide with such portions a conductivity type selectively.

As a result, there is formed, in a self-alignment manner, a source region 1011, a channel region 1012 and a drain region. 1014 of an N-channel type thin film transistor and a source region 1016, a channel region 1015 and a drain region 1013 of a P-channel type thin film transistor.

Figure 21D:
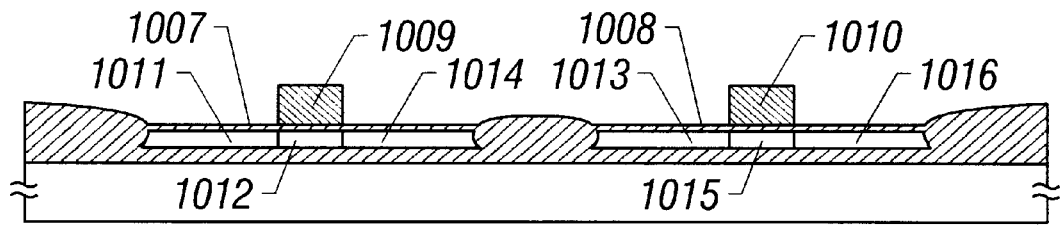
Figure 21E:
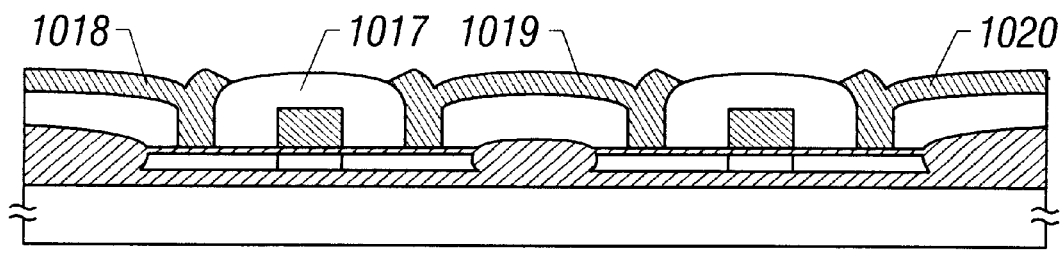

When the doping of impurities for providing the conductivity types, a heating process and then an annealing process are conducted. Thus, the state shown in FIG. 21D is achieved.

Next, an interlayer insulation film 1017 is formed, and contact holes are formed. Then, there is formed a source electrode 1018 for the N-channel type transistor, a common drain electrode 1019, and a source electrode 1020 for the P-channel type transistor. This completes a CMOS circuit.

Embodiment 19

The present embodiment shows an example wherein a metal element other than nickel is used. The use of nickel allows the advantages of the present invention to be most effectively demonstrated and provides excellent process reproducibility. However, other elements may be used in principle. An example will now be shown in which Cu (copper) is used.

When Cu is to be used, a solution of copper acetate $(Cu(CH_3COO)_2)$ may be used in the same manner as for nickel. However, copper acetate must be carefully handled because it is a powerful medicine.

Embodiment 20

The present embodiment will refer to an electronic apparatus employing semiconductor devices fabricated using the present invention.

Figure 22:
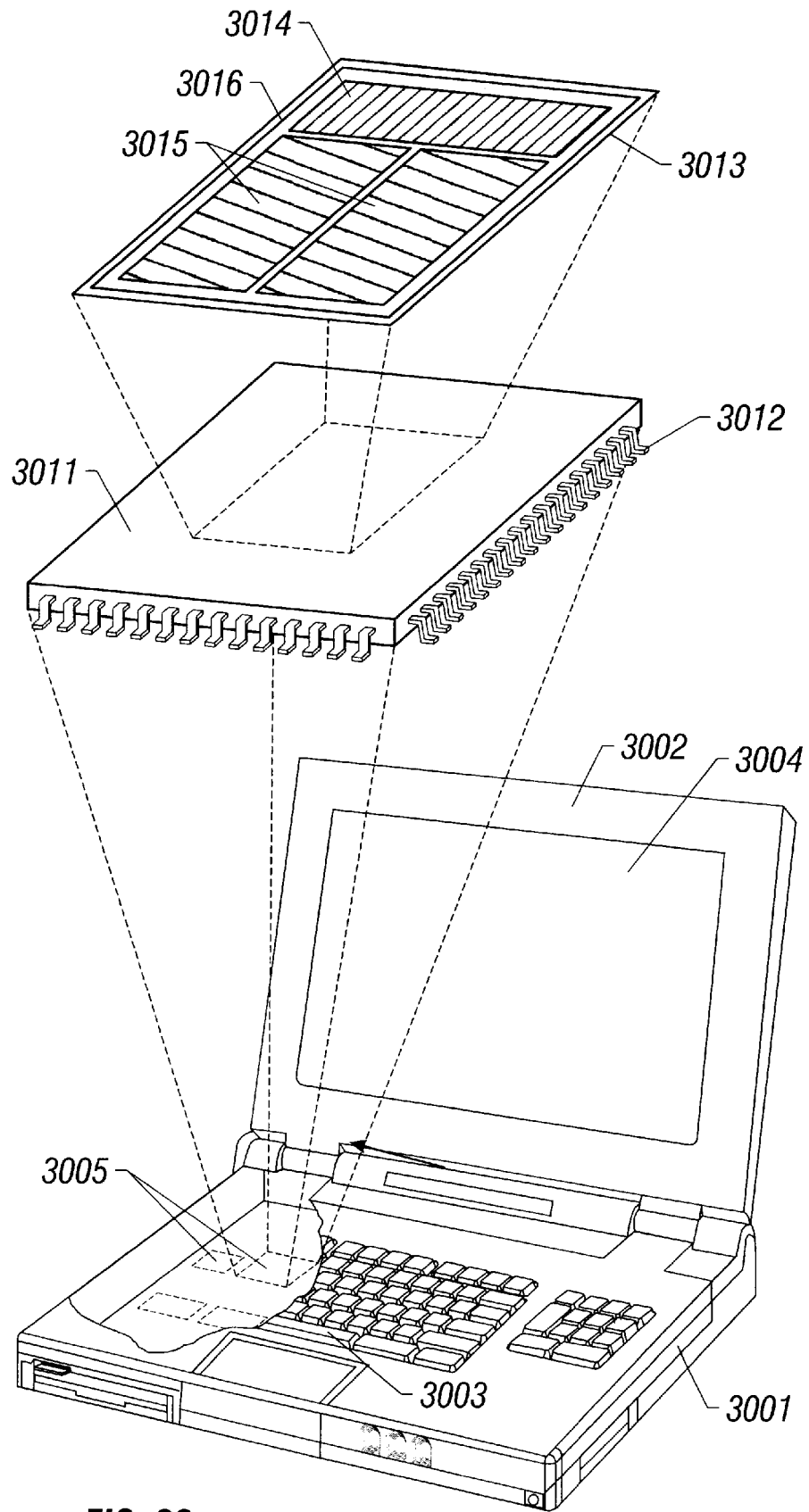
FIG. 22 schematically shows an electronic apparatus utilizing a semiconductor device according to the embodiment 17 of the present invention.
Figure 24A:
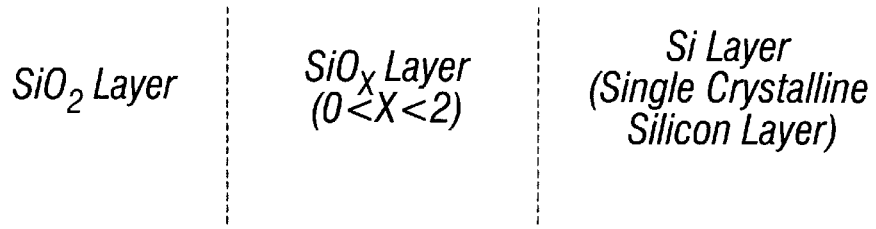
FIGS. 24A through 24D are views showing the distribution of defect densities at an interface between a silicon layer and a silicon oxide layer and in the vicinity of the interface.
Figure 24B:
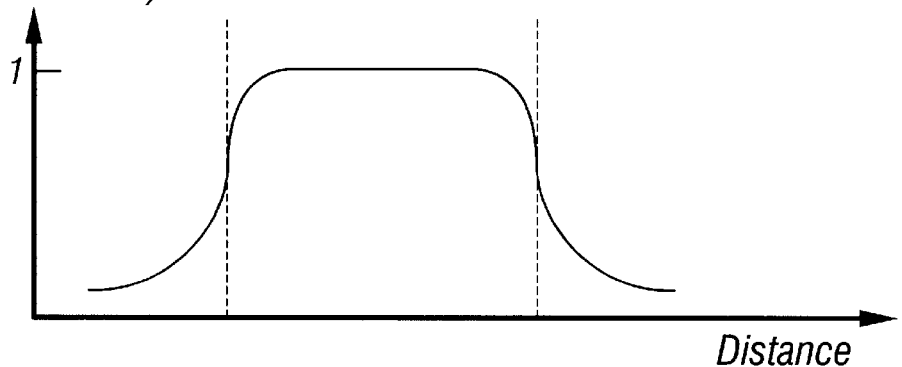
Figure 24C:
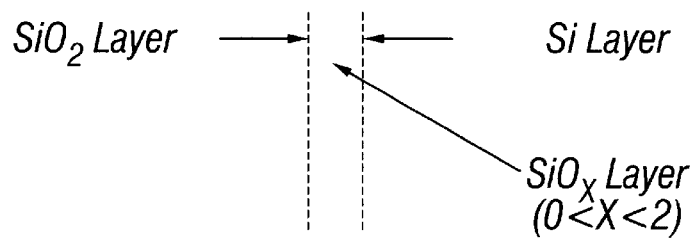
Figure 24D:
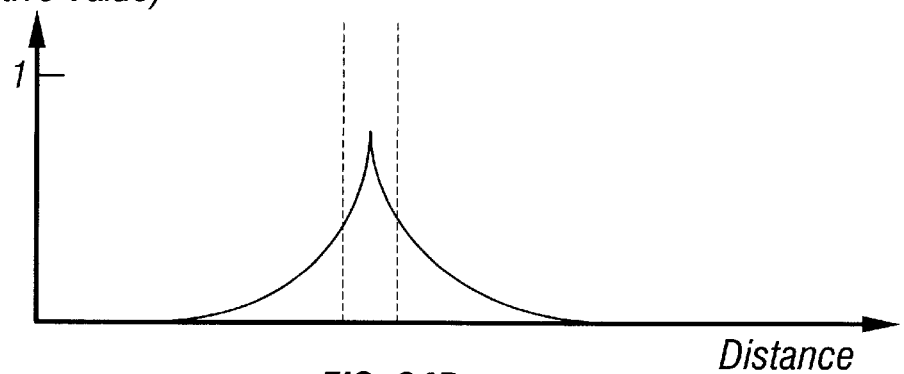
Figure 25A:
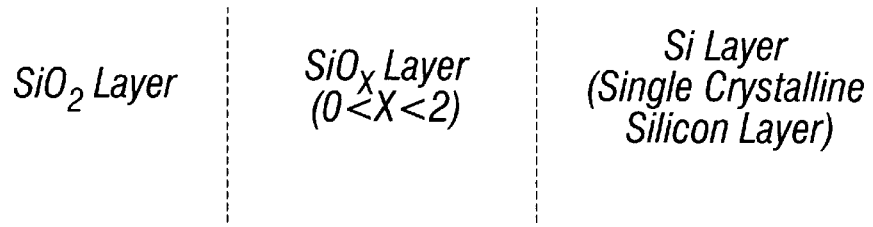
FIGS. 25A through 25D are schematic views showing a state of an interface between a silicon oxide layer and a single crystalline silicon layer.
Figure 25B:
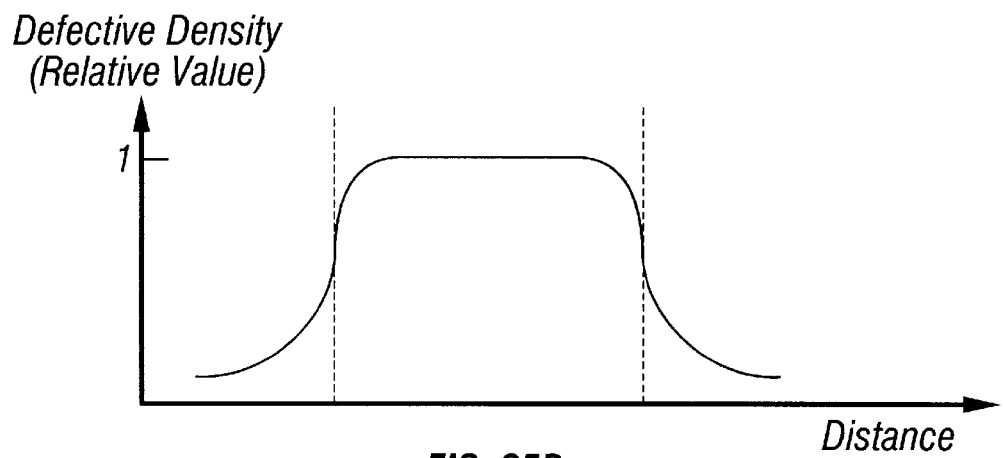
Figure 25C:
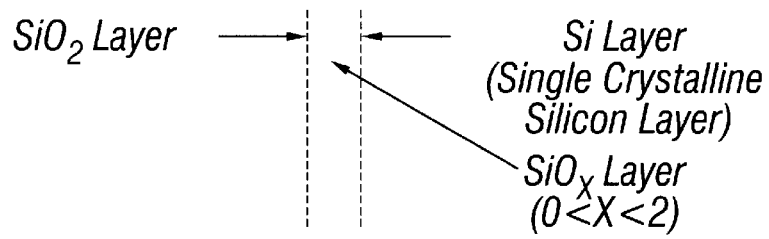
Figure 25D:
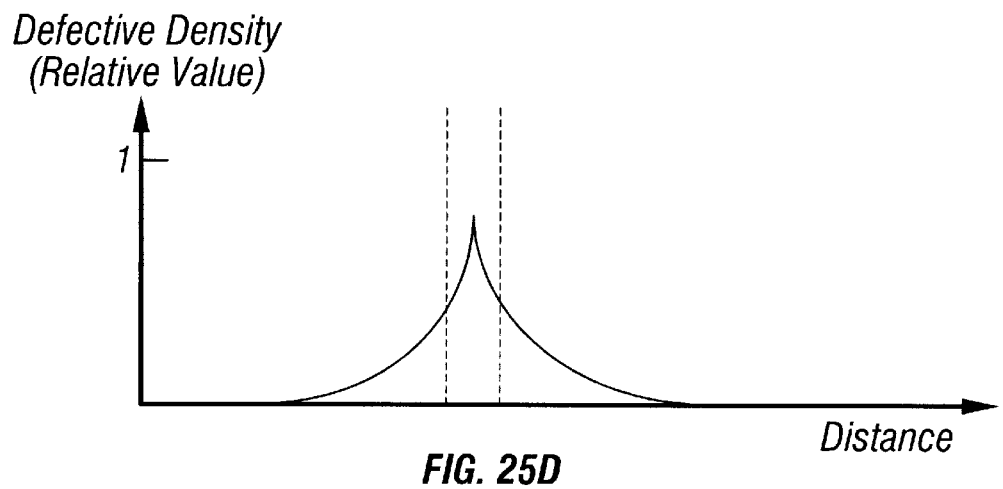

FIG. 22 shows a portable electronic apparatus which is referred to as "personal computer" or "word processor".

In FIG. 22, 3001 designates a main body; 3002 designates a cover including a liquid crystal display 3004 which can be opened and closed; and 3003 designates a keyboard and an operation panel.

This electronic apparatus incorporates a variety of integrated circuits (IC chips) 3005. 3011 designates one of the IC chips indicated by 3005.

The IC chips include those perform the required functions. The IC chip indicated by 3011 is for processing signals for images to be displayed on the liquid crystal display 3004 (referred to as "image signals" or "video signals").

The electronic apparatus shown in FIG. 22 (which is sometimes referred to as "mobile information terminal" instead of "computer") must be connected to a communication network (e.g., a telephone network) to process various kinds of information such as image information.

In processing image information, however, a circuit must operate at a high speed. Further, delays of signals that occur in wiring in addition to the circuit can be a serious problem. As a means for solving this problem, required processing circuits are integrated into a single chip and a configuration is employed which minimizes delays originating in extended wiring.

FIG. 22 shows an IC chip 3011 having such a configuration. Specifically, the IC chip 3011 includes a single crystalline silicon layer obtained using the present invention on a single substrate 3016 and is configured such that required devices are integrated using the single crystalline silicon layer.

A reference numeral 3013 designates a bonding portion which is connected to leads 3012 of the IC chip.

The IC chip shown in FIG. 22 includes a memory circuit 3015 and a processing circuit 3014 for processing image information.

Since the present invention allows a configuration capable of operations at a high speed, it may be advantageously used for configuring an IC chip which is required to process image information.

Embodiment 21

The present embodiment shows an example of the application of an IC chip as indicated by 3011 in FIG. 22 to a portable electronic apparatus having a capability of video imaging (generally referred to as "video camera").

In general, a portable electronic apparatus for image processing must be capable of performing digital processing on an image.

For example, digital techniques are used for a function of preventing blur due to movement of hands, correction of colors, and a zooming function. It is advantageous to use devices obtained employing the present invention in a circuit which is required to achieve such functions.

The present invention eliminates the need for employing a configuration in which a region having the conductivity type reserve to that of the channel of a MOS type semiconductor device at a side of the channel region. That is, the formation of a parasitic channel can be suppressed without employing such a configuration.

It is thus possible to provide a MOS type transistor in which not only the formation of a parasitic channel is suppressed but also the occurrence of a narrow channel effect is suppressed.

In techniques for forming a single crystalline silicon layer utilizing the SIMOX technique, the use of the present invention makes it possible to provide a single crystalline silicon layer having a low defect density.

It is possible to provide a reliable semiconductor device capable of operations at a high speed and various apparatuses utilizing such a semiconductor device.

What is claimed:

1. A MOS semiconductor device having a crystalline semiconductor substrate, said device comprising:
   a thermal oxidation film for device separation formed on said substrate,
   wherein a concentration of a metal element for promoting the crystallization of silicon in a channel region of said MOS semiconductor device is lower than that in said thermal oxidation film.

2. A device according to claim 1 wherein said metal element is nickel.

3. A device according to claim 1 wherein said metal element comprises at least a material selected from the group consisting of Fe, Co, Ni, Ru, Rh, Pd, Os, Ir, Pt, Cu and Au.

4. A device according to claim 1 wherein a concentration of a halogen element in said channel region of said MOS semiconductor device is lower than that in said thermal oxidation film.

5. A semiconductor device comprising:
   an oxide layer formed in a crystalline semiconductor substrate;

a single crystalline semiconductor layer formed on said oxide layer;

an active layer for at least one device formed by said single crystalline semiconductor layer; and a metal element in said active layer at a concentration, wherein the concentration increases toward an interface opposite to said oxide layer.

6. A device according to claim 5 wherein said metal element is nickel.

7. A device according to claim 5 wherein said metal element comprises at least a material selected from the group consisting of Fe, Co, Ni, Ru, Rh, Pd, Os, Ir, Pt, Cu and Au.

8. An electronic apparatus having semiconductor devices comprising an oxide layer formed in a crystalline semiconductor substrate and a single crystalline semiconductor layer formed on said oxide layer, said apparatus comprising:

an active layer for at least one device formed by said single crystalline semiconductor layer; and a metal element in said active layer with at a concentration, wherein the concentration increases toward the interface opposite to said silicon oxide layer.

9. An apparatus according to claim 8 wherein said metal element is nickel.

10. An apparatus according to claim 8 wherein said metal element comprises at least a material selected from the group consisting of Fe, Co, Ni, Ru, Rh, Pd, Os, Ir, Pt, Cu and Au.

11. A device according to claim 1 wherein said semiconductor is silicon.

12. A device according to claim 5 wherein said semiconductor is silicon.

13. An apparatus according to claim 8 wherein said semiconductor is silicon.

* * * * *